US012791580B2

(12) United States Patent
Thinakaran et al.

(10) Patent No.: US 12,791,580 B2
(45) Date of Patent: Nov. 10, 2026

(54) METHODS AND APPARATUS FOR SOURCE MEASUREMENT UNIT (SMU) OPERATION

(71) Applicant: Texas Instruments Incorporated, Dallas, TX (US)

(72) Inventors: Rajavelu Thinakaran, Bangalore (IN); Gautam Salil Nandi, Bangalore (IN); Hariharan Srinivasan, Chennai (IN); Rahul Shaw, Asansol (IN); Abhishek Ghosh, Bangalore (IN); Taras Dudar, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 120 days.

(21) Appl. No.: 18/605,556

(22) Filed: Mar. 14, 2024

(65) Prior Publication Data

US 2024/0310411 A1 Sep. 19, 2024

(30) Foreign Application Priority Data

Oct. 4, 2023 (IN) ............................ 202341066406
Oct. 19, 2023 (IN) ............................ 202341071247

(51) Int. Cl.
*G01R 1/067* (2006.01)

(52) U.S. Cl.
CPC ................................ *G01R 1/06766* (2013.01)

(58) Field of Classification Search
CPC ............ G01R 1/06766; G01R 31/2879; G01R 31/3008; H03F 1/42; H03F 1/56; H03F 2203/45138; H03F 3/45192; H03F 3/45475
See application file for complete search history.

(56) References Cited

U.S. PATENT DOCUMENTS 5,030,925 A 7/1991 Taylor
5,708,392 A 1/1998 Gross
5,773,990 A 6/1998 Wilstrup et al.
(Continued)

FOREIGN PATENT DOCUMENTS

JP S6217666 A 1/1987
JP H085676 A 1/1996
(Continued)

OTHER PUBLICATIONS

International Search Report in corresponding PCT Application No. PCT/US2024/020057, mailed Aug. 8, 2024.
(Continued)

*Primary Examiner* — Vinh P Nguyen
(74) *Attorney, Agent, or Firm* — Xianghui Huang; Charles F. Koch

(57) ABSTRACT

An apparatus includes a circuit including a force amplifier having an output, a resistor having a first terminal coupled to the output of the force amplifier, and a second terminal. The circuit also includes a diode clamp including a first diode having a first terminal coupled to the first terminal of the resistor, and having a second terminal coupled to the second terminal of the resistor, the first diode having a first orientation. The diode clamp also includes a second diode coupled in parallel with the first diode between the first and second terminals of the resistor, the second diode having a second orientation opposite than the first diode.

19 Claims, 17 Drawing Sheets

(56) References Cited

U.S. PATENT DOCUMENTS

| | | | | |
|---|---|---|---|---|
| 6,545,544 | B1 | 4/2003 | Link et al. | |
| 7,154,260 | B2 | 12/2006 | Chow | |
| 7,616,417 | B2 * | 11/2009 | Yoshida | G01R 31/2879<br>361/111 |
| 11,522,554 | B2 * | 12/2022 | Zhang | H03M 3/356 |
| 12,422,474 | B2 * | 9/2025 | Neema | H03M 1/662 |
| 2024/0310432 | A1 * | 9/2024 | Nandi | G01R 31/2834 |

FOREIGN PATENT DOCUMENTS

| | | | | |
|---|---|---|---|---|
| JP | 3599256 | B2 | | 12/2004 |
| JP | 2009115647 | A | * | 5/2009 |
| JP | 2009243937 | A | | 10/2009 |
| JP | 4936134 | B2 | | 5/2012 |
| JP | 5012430 | B2 | | 8/2012 |

OTHER PUBLICATIONS

Machine Translation for JP3599256B2.
Machine Translation for JP4936134B2.
Machine Translation for JPS6217666A.
Machine Translation for JP5012430B2.
Machine Translation for JP2009243937A.
Machine Translation for JPH085676A.

* cited by examiner

200

(TABLE SHOWS 0 TO 30V STEP AT 32V HEADROOM)

| CLOAD (F) 202 | 30V STEP 0.05% SETTLING TIME (s); (VCC,VEE) = (32,-10V) | | | |
|---|---|---|---|---|
| | 5uA 204 | 40uA 206 | 200uA 208 | 2mA 210 |
| 1.00E-09 | 8.11E-04 | 2.80E-04 | 3.05E-05 | 2.40E-05 |
| 1.00E-08 | 5.66E-03 | 9.20E-04 | 3.64E-04 | 1.33E-04 |
| 1.00E-07 | 5.58E-02 | 7.13E-03 | 1.63E-03 | 5.48E-04 |
| 1.00E-06 | 5.59E-01 | 6.88E-02 | 1.40E-02 | 3.31E-03 |
| 1.00E-05 | 5.60E+00 214 | 6.85E-01 | 1.37E-01 | 3.15E-02 |

212

FIG. 2A

240

| CLOAD (F) 202 | 30V STEP 0.05% SETTLING TIME (s); (VCC,VEE) = (32,-10V) | | | |
|---|---|---|---|---|
| | 5uA 204 | 40uA 206 | 200uA 208 | 2mA 210 |
| 1.00E-09 | 4.58E-04 | 1.84E-04 | 2.93E-05 | 2.40E-05 |
| 1.00E-08 | 1.97E-03 | 4.85E-04 | 2.72E-04 | 1.27E-04 |
| 1.00E-07 | 1.68E-02 | 2.65E-03 | 9.81E-04 | 5.47E-04 |
| 1.00E-06 | 1.63E-01 | 2.39E-02 | 7.50E-03 | 3.31E-03 |
| 1.00E-05 | 1.57E+00 216 | 2.35E-01 | 7.27E-02 | 3.15E-02 |

212

FIG. 2B

280

| CLOAD (F) 202 | 30V STEP 0.05% SETTLING TIME (s); (VCC,VEE) = (32,-10V) | | | |
|---|---|---|---|---|
| | 5uA 204 | 40uA 206 | 200uA 208 | 2mA 210 |
| 1.00E-09 | 2.41E-05 | 2.41E-05 | 2.42E-05 | 2.40E-05 |
| 1.00E-08 | 2.14E-04 | 1.45E-04 | 1.32E-04 | 1.32E-04 |
| 1.00E-07 | 2.71E-03 | 8.10E-04 | 5.97E-04 | 5.45E-04 |
| 1.00E-06 | 2.58E-02 | 5.85E-03 | 3.78E-03 | 3.31E-03 |
| 1.00E-05 | 2.20E-01 218 | 5.55E-02 | 3.56E-02 | 3.15E-02 |

212

FIG. 2C

METHODS AND APPARATUS FOR SOURCE MEASUREMENT UNIT (SMU) OPERATION

CROSS-REFERENCE TO RELATED APPLICATION

This patent application claims the benefit of and priority to Indian Provisional Patent Application Ser. No. 202341066406 filed Oct. 4, 2023, Indian Provisional Patent Application Ser. No. 202341071247 filed Oct. 19, 2023, and Indian Provisional Patent Application Ser. No. 202341017721 filed Mar. 16, 2023, all of which are hereby incorporated herein by reference in their entireties.

TECHNICAL FIELD

This description relates generally to device under test (DUT) measurement systems and, more particularly, to methods and apparatus for source measurement unit (SMU) operation.

BACKGROUND

Device test systems provide different types of electrical characteristics to a device under test (DUT). For example, source measurement units (SMUs) may subject a DUT to force voltage inputs, force current inputs, and other types of electrical characteristics to test one or more DUTs, for instance prior to sale or distribution. In manufacturing environments, a speed at which the DUT can be tested improves a manufacturing throughput.

SUMMARY

An example apparatus includes a circuit including a force amplifier having an output, a resistor having a first terminal coupled to the output of the force amplifier, and a second terminal. The example circuit also includes a diode clamp including a first diode having a first terminal coupled to the first terminal of the resistor, and having a second terminal coupled to the second terminal of the resistor, the first diode having a first orientation. The example diode clamp also includes a second diode coupled in parallel with the first diode between the first and second terminals of the resistor, the second diode having a second orientation opposite than the first diode.

BRIEF DESCRIPTION OF THE DRAWINGS

FIGS. 2A through 2C are tables illustrating settling times for different device under test (DUT) loading conditions.

Figure 1:
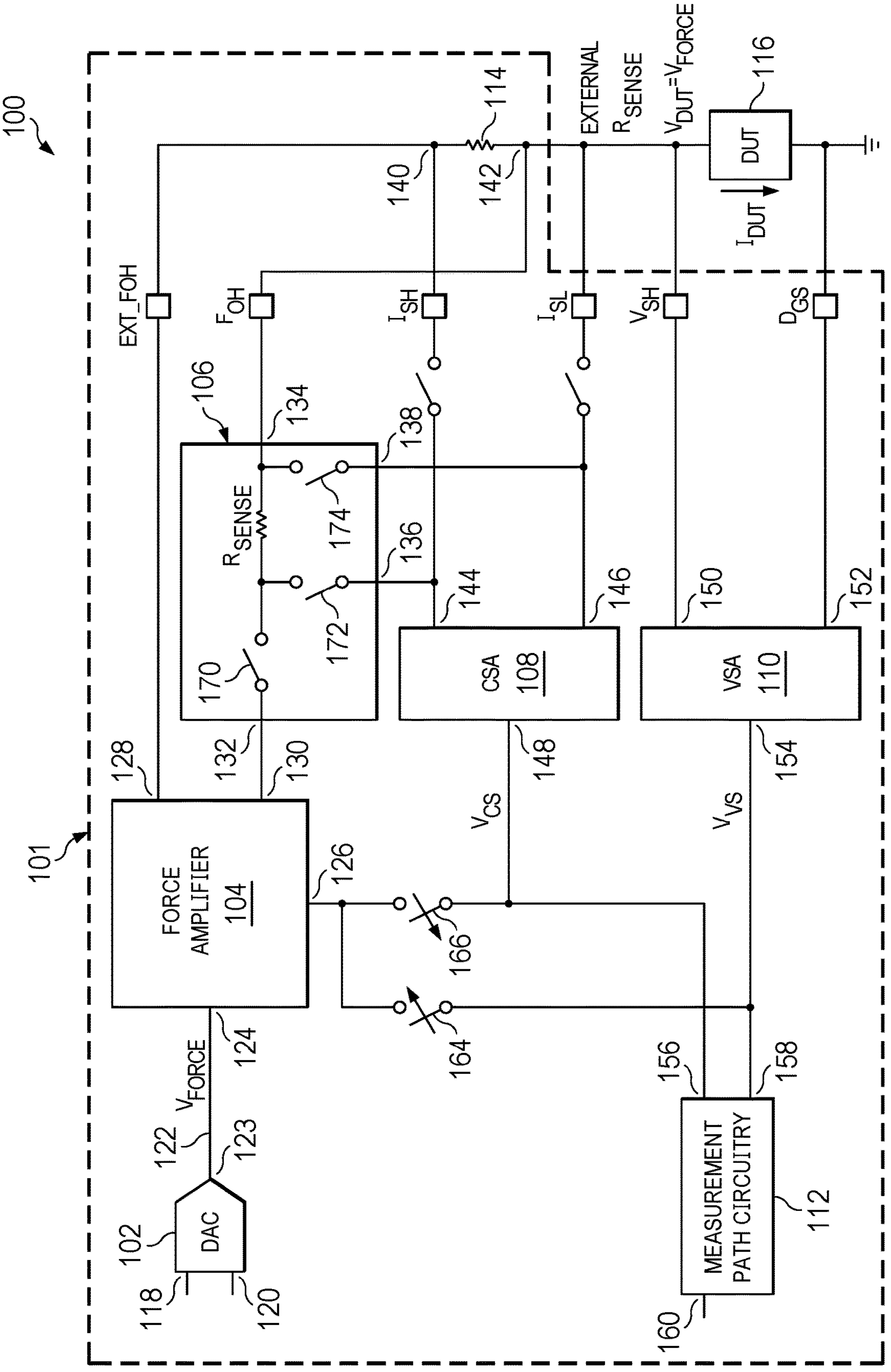
FIG. 1 is a block diagram of an example source measurement unit (SMU) to test electrical devices.

The drawings are not necessarily to scale. Generally, the same reference numbers in the drawing(s) and this description refer to the same or similar (functionally and/or structurally) features and/or parts. Although the drawings show regions with clean lines and boundaries, some or all of these lines and boundaries may be idealized. In reality, the boundaries or lines may be unobservable, blended or irregular.

DETAILED DESCRIPTION

FIG. 1 is a block diagram of an example testing environment 100 that includes a source measurement unit (SMU) 101. In some examples, circuitry of SMU 101 are implemented on a single integrated circuit (IC) and may be coupled to a resistor 114 external to the chip and to a device under test (DUT) 116. In other examples, circuitry of the SMU 101 are included in multiple ICs and/or the resistor 114 is included on the same chip or in the same IC package as circuitry of the SMU 101.

The SMU 101 of FIG. 1 includes one channel. A channel includes circuitry for forcing an electrical characteristic to a single DUT and responsively measuring an electrical characteristic of the DUT. In another example, a SMU includes two or more channels, in which case, the SMU may be referred to as a parametric measurement unit (PMU). Multiple channels may be used in coordination to force voltage or current to one or more DUTs. Herein, channel and SMU channel are used interchangeably. In an example, the SMU 101 can be set to a force voltage mode to provide a constant or substantially constant voltage to the DUT 116 or a force current mode to provide a constant or substantially constant current to the DUT 116. Further to this example, the SMU 101 can be set to a current measure mode or a voltage measure mode to, respectively, measure a current or a voltage at the DUT 116. Various switches in the SMU 101 may be opened and closed (for instance using a controller that is not shown) to set the mode of the SMU 101.

In the example of FIG. 1, the SMU 101 includes digital-to-analog (DAC) circuitry 102 having a first input signal 118 and a second input signal 120. The DAC 102 converts digital values indicative of a target value to corresponding analog values, in which the DAC may be implemented using analog circuitry including multiple comparators and resistors. The first input signal 118 and the second input signal 120 receive digital input signals corresponding to target force voltage values (VFORCE) 122 and offset values at a first output signal 123. The SMU 101 includes an example force amplifier (FA) 104 having a first input signal 124, a second input signal 126, a first output signal 128 and a second output signal 130. The first input signal 124 of the FA 104 is coupled to the output signal 123 of the DAC circuitry 102 to allow target voltage force values to be set at the DUT 116 at target load current values. The SMU 101 includes a resistor array 106 (also referred to as a sense resistor array) having a first terminal 132, a second terminal 134, a third terminal 136 and a fourth terminal 138. The resistor array 106 includes a first switch 170, a second switch 172 and a third switch 174. The first terminal 132 of the resistor array 106 is coupled to the second output 130 of the FA 104. In an example, the resistor array 106 includes internal selectable values of resistance for measuring the DUT current, as described in further detail below. The SMU 101 includes a second resistor 114 having a first terminal 140 and a second terminal 142. In some examples, the second resistor 114 is referred to as an external resistor and it used to measure current values of the DUT 116 in relatively high-current modes.

The SMU 101 includes a current sense amplifier (CSA) 108 having a first input signal 144, a second input signal 146 and an output signal 148. The CSA 108 measures current values and may be implemented using analog circuitry including multiple comparators and resistors. The first input signal 144 and the second input signal 146 of the CSA 108 are coupled to the resistor array 106 or the second resistor 114. Particular switch configurations determine which of the resistor array 106 or the second resistor 114 derive current values for the DUT based on voltage measurements of the respective resistor array 106 or the second resistor 114. The output signal 148 of the CSA 108 provides particular current values to the DUT. The SMU 101 includes a voltage sense amplifier (VSA) 110 having a first input 150, a second input 152 and an output 154. The VSA 110 measures voltage values and may be implemented using analog circuitry including multiple comparators and resistors. The first input 150 and the second input 152 of the VSA 110 are coupled to the DUT 116 to measure voltage values at the DUT. The SMU 101 includes measurement path circuitry 112 having a first input 156, a second input 158, an output signal 160. The measurement path circuitry 112 performs analysis functions corresponding to devices under test and may be implemented using processor circuitry and/or analog circuitry including multiple comparators and resistors. The first input 156 of the measurement path circuitry 112 is coupled to the output 148 of the CSA 108 and the second input 158 of the measurement path circuitry 112 is coupled to the output 154 of the VSA 110. The measurement path circuitry 112 includes any number of sub-circuits to facilitate, in part, voltage scaling, measurement path filtering, and diagnosis multiplexing for the measured voltages and currents from the CSA 108 and the VSA 110. The output signal 160 of the measurement path circuitry 112 may be analog or digital. The SMU 101 includes a force voltage switch 164 and a force current switch 166 to control whether the SMU 101 operates in the force voltage mode or the force current mode.

Examples described below include methods and apparatus that may be implemented in the SMU 101 which may achieve example benefits that include, but are not limited to, reduced settling time in low current circumstances, reduced heat generation and/or dissipation in open-circuit DUT fault circumstances, reduced measurement errors in view of gain resistor mismatch, and reduced switch complexity when ganging two or more SMU channels together (e.g., to supply relatively greater amounts of current to a DUT).

Settling Time Improvements

During a force voltage mode of the SMU 101, settling time is observed to increase for relatively low current ranges of a DUT due to the implementation of large current sense resistors in series with the output(s) of the FA 104. For example, a DUT with a capacitive load component will charge to a target value over a finite period of time. However, the finite period of time increases when a target DUT current is lowered by using relatively larger resistor values for current sensing. Test environments demand ever increasing throughput performance that is thwarted by elongated settling times in low current environments and/or in environments with relatively low headroom (e.g., a difference between a target output voltage at the DUT and a maximum output voltage supplied by the SMU). Some approaches to reduce a settling time include implementation of slew boost circuitry. However, such circuitry adds cost, consumes real estate, and contributes to a relatively greater amount of power dissipation. Also, such slew boost circuitry techniques are still limited by reduced output current values caused by relatively large current sense resistors.

Some techniques to apply a force voltage load to a DUT engage different sense resistor values to measure a target current. In a force voltage mode of the SMU, the current sense resistor is added in series to the output of the force amplifier. To support multiple current ranges, multiple current sense resistors are available for use in the series configuration with the DUT, such as an example 200 kOhm resistor for a 5 uA range, an example 25 kOhm resistor for a 40 uA range, an example 5 kOhm resistor for a 200 uA range, and an example 500 Ohm resistor for a 2 mA range. A settling time for a DUT when the SMU is in a force voltage mode is determined in a manner consistent with example Equation 1.

$$\text{Slew Time} = \frac{(\text{Capacitive Load}) * (\text{Voltage})}{(\text{Current Limit})}. \qquad \text{Equation 1}$$

To illustrate the example of Equation 1, consider a 10 uF load capacitor for a 30V voltage step and a current limit of 10 mA. This example configuration results in a settling time of 30 mSec. While the above example calculation is valid for high current ranges (e.g., 2 mA range), it is not applicable for low current ranges. For instance, in low current ranges (e.g., 5 uA range) in which a 200 kOhm sense resistor is used for an improved measurement accuracy for the dynamic range, a maximum output current is limited in a manner consistent with example Equation 2.

$$\text{Max Current} = \frac{\text{Max Force Voltage Output}}{\text{Sense Resistance}}. \qquad \text{Equation 2}$$

To illustrate the example of Equation 2, consider a maximum FV output of 48V and a 200 kOhm sense resistor, which results in a maximum current value of 240 uA. In this example configuration, the settling time is substantially limited by the sense resistor and capacitive load time constant. Similar to the example above, considering a 10 uF load capacitor for a 30V voltage step, a corresponding settling time is approximately 6 seconds.

FIG. 2A is a table 200 having a capacitive load column 202 with corresponding rows of load capacitance values, and target current range columns depending on a target current range for the DUT (e.g., the 5 uA range, the 40 uA range, the 200 uA range, and the 2 mA range). SMUs accommodate for different current ranges so that measurement accuracy corresponds to a particular dynamic range.

For example dynamic range targets described herein, a full voltage measurement range of the sense resistor is 1 volt. As such, for relatively low DUT current testing, a 5 uA range of the SMU maintains the 1V dynamic range over the sense resistor for measurement purposes. In the example of FIG. 2A, the table 200 includes a 5 uA column 204, a 40 uA column 206, a 200 uA column 208, and a 2 mA column 210. Further to the example above, if a 5 uA range, a corresponding 200 K-ohm resistor is selected for the sense resistor. For a capacitive load value of 10 uF (see row 212) and a headroom of 32V, the table 200 of FIG. 2A illustrates that a corresponding settling time of 5.60 seconds occurs (see item 214). Examples described herein reduce such settling time values, as shown in a table 240 of FIG. 2B corresponding to implementation of a diode clamp. Examples described herein also reduce settling time values as shown in a table 280 of FIG. 2C, which corresponds to implementation of a diode clamp and slew detection circuitry, as described in further detail below.

Figure 3:
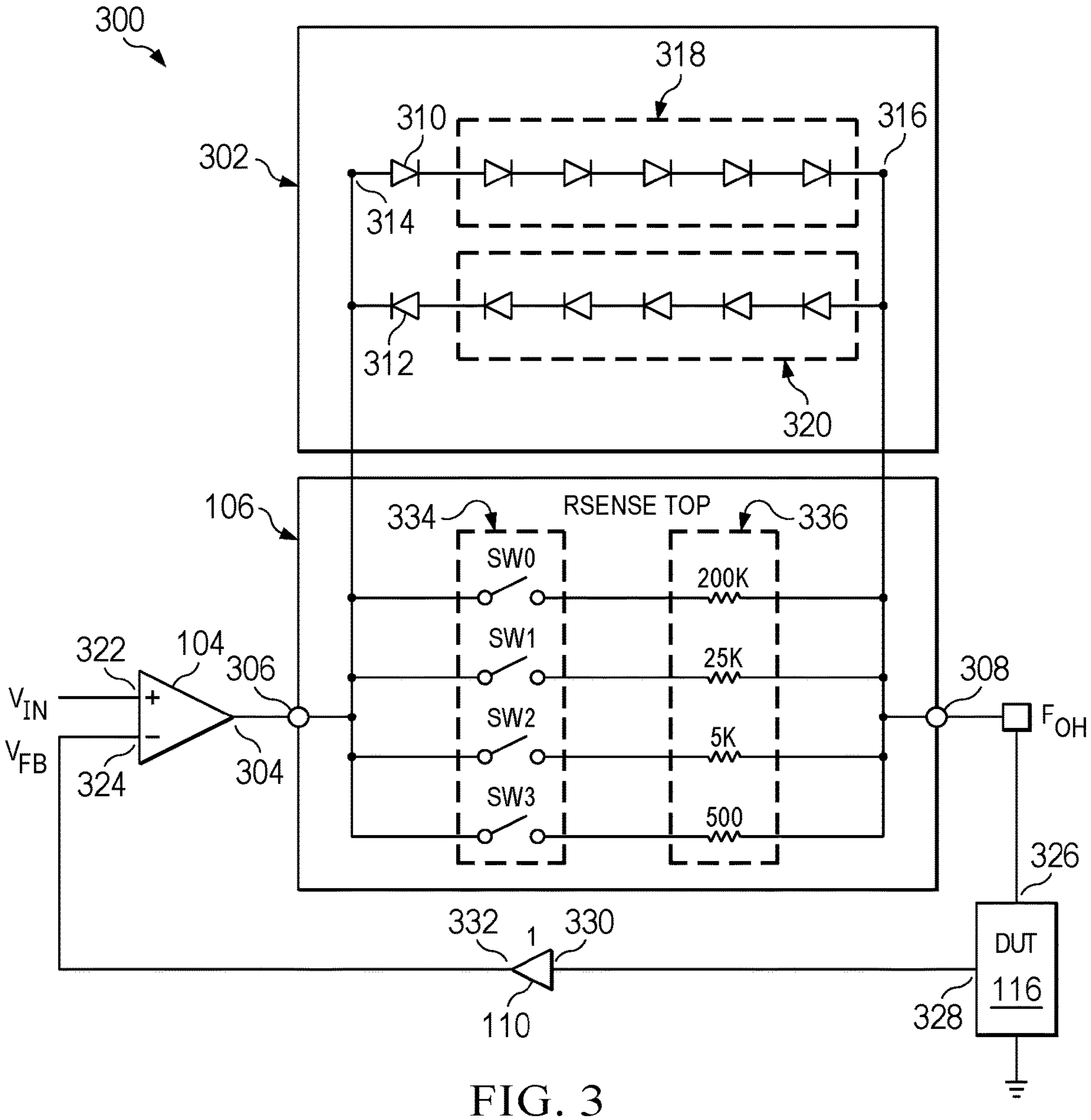
FIG. 3 is a block diagram of an example force voltage loop including a diode clamp.

FIG. 3 is an example force voltage loop 300, e.g., for the SMU 101 of FIG. 1, that includes FA 104, sense resistor array 106, an example diode clamp 302, an example DUT 116, and an example voltage sense amplifier (VSA) 110. In the example of FIG. 3, the FA 104 has a first input signal 322, such as a voltage setpoint input), a second input signal 324, such as a negative feedback input, and an output signal 304. In the example of FIG. 3, the sense resistor array 106 has a first terminal 306 and a second terminal 308. The sense resistor array 106 includes a bank of switches 334 and a corresponding bank of sense resistors 336 coupled in series with the bank of switches 334 between the terminals 306 and 308.

In the example of FIG. 3, the diode clamp 302 has a first terminal 314 coupled to the first terminal 306 of the sense resistor array 106, and a second terminal 316 coupled to the second terminal 308 of the sense resistor array 106. The second terminal 316 and the second terminal 308 are coupled to a first load terminal 326 that may electrically connect to any load under test, such as the DUT 116. A second load terminal 328 is coupled to an input 330 of the VSA 110, in which the second load terminal 328 may electrically connect to any load under test, such as another terminal of the DUT 116. The diode clamp 302 also includes a first diode 310 having a first orientation and a second diode 312 having a second orientation opposite to the first orientation of the first diode 310. In some examples, the diode clamp 302 includes any number of one or more diodes coupled to the first diode 310 and the second diode 312. In the example of FIG. 3, the diode clamp 302 includes a first set of additional diodes 318 coupled in series with the first diode 310 between terminals 306 and 308 and having the same orientation as the first diode 310. In the example of FIG. 3, the diode clamp 302 includes a second set of additional diodes 320 coupled in series with the second diode 312 between terminals 306 and 308 and having the same orientation as the second diode 312. The example of FIG. 3 includes six (6) diodes having the first orientation in parallel with six (6) diodes having the second orientation opposite the first orientation. However, examples described herein are not limited thereto. Alternate quantities of diodes may be considered based on, for example, target tolerable leakage current during steady state conditions, target voltage drop values across one or more sense resistors, etc. Generally speaking, measurement accuracy of the sense resistor array 106 is improved when leakage of the diode clamp 302 is reduced, and a relatively greater number of series diodes requires a commensurate greater voltage value to cause diode conduction.

In operation, the FA 104 supplies a voltage to the DUT 116 in an effort to reach a target DUT voltage value. For example, consider a power supply voltage input (VCC) for the FA 104 is 32V, and the DUT voltage is forced to 30V. This results in a headroom of only 2V. However, in other examples a relatively larger FA supply voltage may enable a relatively greater headroom, thereby resulting in a relatively faster settling time to achieve the target DUT voltage value. In another example, also consider that the FA 104 is limited to supply no more than 10 mA of current across a 200 kOhm sense resistor (e.g., in the sense resistor array 106). An initial transient of these conditions results in a ramp-up of voltage across the sense resistor that initially is lower than the conduction turn-on voltage of the diode clamp 302 (e.g., six diodes, each having a turn on voltage of 0.6v requires 3.6V to cause the clamp 302 to turn on). When the diode clamp 302 is conducting, it routes a majority of the 10 mA supply current from the FA 104 to the DUT 116. Stated differently, the diode clamp 306 causes a sense resistor bypass during initial charging of the DUT 116, thereby reducing the settling time required to reach a target DUT voltage.

Once the DUT 116 is charged to its target value of 30V (e.g., as measured by the VSA 110), the sense resistor will reach a steady-state value. The steady-state value is designed to be no larger than 1V for the 5 uA SMU range setting. Stated differently, the full scale measurements across the resistor array 106 occur between 0V and 1V in the 5 uA SMU range setting to maintain accurate readings in a low current SMU mode. Because a steady-state voltage value over the sense resistor is lower than the conduction voltage of the diode clamp 302, the diode clamp 302 will turn off so as not to interfere with any subsequent measurements during testing of the DUT at its target voltage value. Briefly returning to the example of FIG. 2B, the table 240 illustrates that the diode clamp 302 results in a settling time of approximately two seconds (see item 216) as compared to the previous settling time of 5.6 seconds (see item 214 of FIG. 2A) without the benefit of the diode clamp 302.

Figure 4:
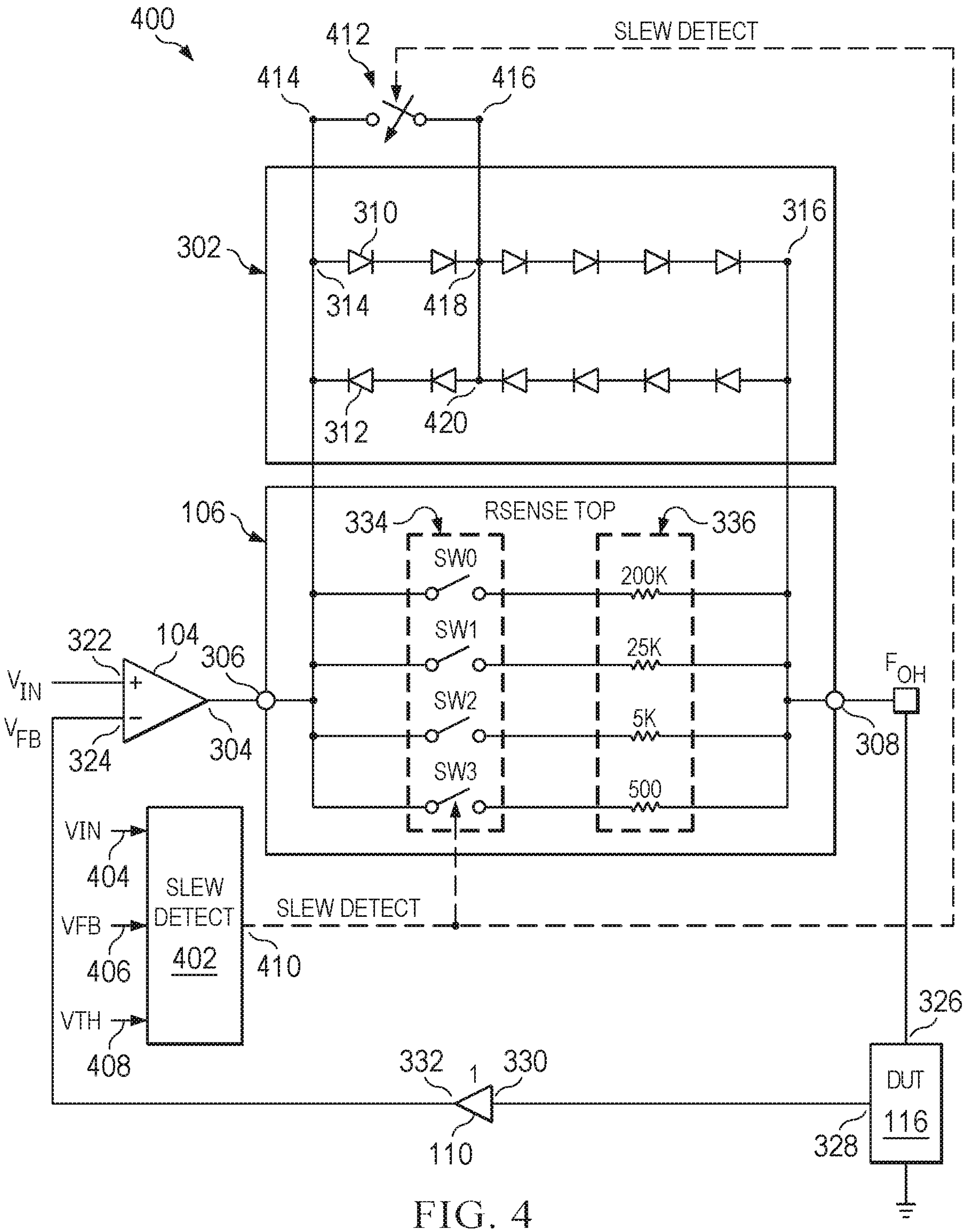
FIG. 4 is a block diagram of an example force voltage loop including a diode clamp and slew detection circuitry.

FIG. 4 is an example force voltage loop 400 that includes additional structure as compared to the example force voltage loop 300 of FIG. 3. Elements of FIG. 4 that are similar to FIG. 3 include the same reference numbers and are not re-described. The force voltage loop 400 of FIG. 4 further includes slew detection circuitry 402 (e.g., a comparator) having a first input signal 404, a second input signal 406 a third input signal 408, and an output signal 410. In some examples, the first input signal 404 receives a voltage input signal, the second input signal 406 receives a voltage feedback signal, the third input signal 408 receives a voltage threshold signal, and the output signal 410 provides a slew detect TRUE signal (e.g., logic high) and/or control signal for one or more of the bank of switches 334. The example of FIG. 4 includes a diode quantity selection switch 412 having a first terminal 414 and a second terminal 416. The first terminal 414 of the diode quantity selection switch 412 is coupled to the first terminal 314 of the diode clamp 302, and the second terminal 416 of the diode quantity selection switch 412 is coupled to a portion of the diodes within the diode clamp 302. In some examples, the second terminal 416 of the diode quantity selection switch 412 is coupled to a bridge terminal having a first terminal 418 and a second terminal 420 that, when placed within one of the portions of the diode clamp 302 cause a selected quantity of diodes to be engaged in the diode clamp 302. For instance, some implementations of the SMU target different forced characteristics on the DUT 116 that expect different leakage characteristics of the diode clamp 302.

In operation, the FA 104 supplies a force voltage to the DUT 116, in which the DUT 116 is initially at zero volts and/or otherwise not energized for testing purposes. The slew detection circuitry 402 compares a force voltage value established by the first input 322 of the FA 104 and the second input signal 406 corresponding to a feedback voltage for the DUT 116 against a threshold input signal (e.g., a threshold voltage value, such as 0.5V) at the third input signal 408. Assuming a threshold voltage at the third input signal 408 of 0.5V, and assuming the FA 104 drives at 32V, the initial feedback voltage is zero at time zero. As such, because the threshold voltage value is satisfied, the output signal 410 of the slew detection circuitry 402 is TRUE (e.g., a logic HIGH value), which causes SW3 to close to add a 500 Ohm resistor in series with the DUT 116. Also, if the SMU is configured to operate in a low current mode (e.g., a 5 uA range), then SW0 is also closed, which causes a 200 kOhm resistor to be coupled to the DUT 116. For example, the SMU is configured by an end user to subject one or more devices under test to particular electrical characteristics. At early transient stages of forced voltage to the DUT 116, the diode clamp 302 is not energized until a threshold volage of the diodes in series is reached. At that time, the diode clamp 302 operates as a bypass to the sense resistor(s) (the sense resistor array 106) to allow the DUT 116 to charge faster because the resistors are substantially prevented from restricting current flow to the DUT 116.

As the DUT 116 approaches its target voltage (e.g., 30V), the diode clamp turns off because the threshold conduction voltage has dropped. For example, the threshold conduction volage drops below a value indicative of a quantity of series diodes and the conduction voltage per diode. For example, the diode clamp 302 turns off at approximately 27V, which results in the current load being carried by the resistor array 106. If not for the slew detection circuitry 402 causing the 500 Ohm resistor to be engaged, then all current would be flowing through the relatively larger 200 KOhm resistor. However, because the slew detection circuitry 402 determines that the threshold voltage of 0.5V is still TRUE, the relatively lower 500 Ohm resistor permits current flow to the DUT 116 at a rate faster than would otherwise be possible if only the 200 KOhm was coupled to the DUT 116. Briefly returning to the example of FIG. 2C, the table 280 illustrates that the diode clamp 302 plus the slew detection circuitry 402 results in a settling time of approximately 200 mSec (see item 218 of FIG. 2C), which is a substantially shorter duration when compared to the benefit of the diode clamp 302 alone (compare to item 216 of FIG. 2B).

In some examples, the output signal 410 of the slew detection circuitry 402 controls the diode quantity selection switch 412. In operation, a TRUE signal from the slew detection circuitry 402 and/or a diode quantity selection signal causes a particular quantity of diodes in the diode clamp 302 to be engaged, thereby allowing user flexibility in behavior of the SMU during force voltage mode operation (s).

Figure 5:
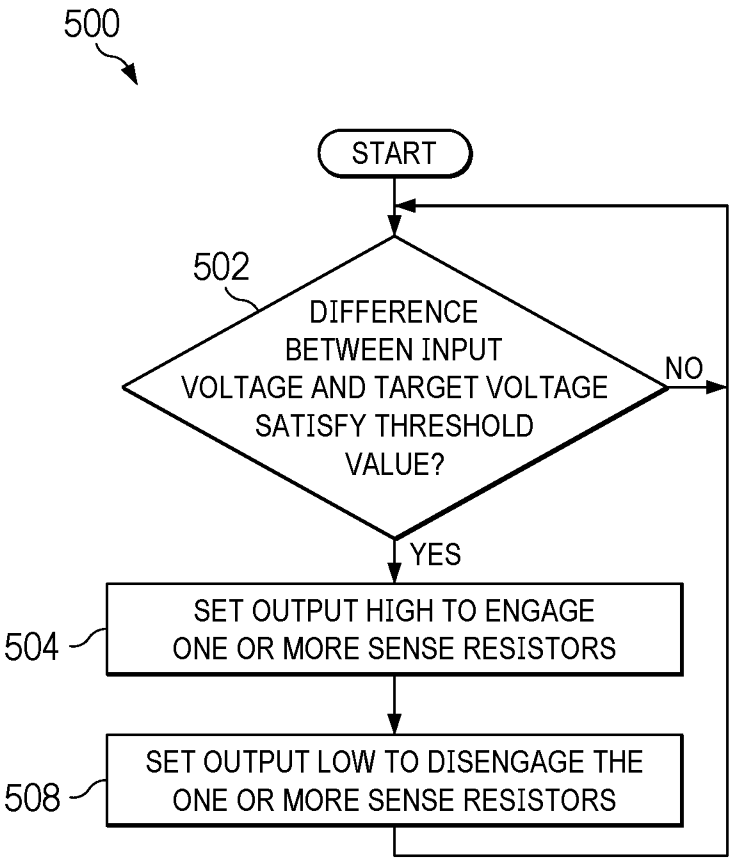
FIG. 5 is a flowchart representative of example operations that may be performed by the slew detection circuitry with the diode clamp of FIG. 4.

FIG. 5 is a flowchart representative of example operations 500 to control sense resistor configuration. The example operations 500 of FIG. 5 begin at block 502, at which the slew detection circuitry 402 compares a difference between the voltage VIN and VFB signals to a threshold voltage and outputs a signal output 410. As such, the slew detection circuitry 402 determines whether a difference between an input voltage (e.g., VI at the first input signal 404 of the slew detection circuitry 402) and a feedback voltage (e.g., FB at the second input signal 406 of the slew detection circuitry 402, which may correspond to a target voltage) satisfies (e.g., exceeds) a threshold value (e.g., VTH at the third input signal 408 of the slew detection circuitry 402). If not, then the slew detection circuitry 402 takes no action and/or otherwise maintains a value of FALSE (e.g., logic LOW, 0V) at the output signal 410. However, if the difference between voltages at the first input signal 404 and the second input signal 406 satisfies the threshold value at the third input signal 408 (e.g., 0.5V) (block 502), then the slew detection circuitry 402 toggles, closes, and/or otherwise drives the output signal 410 to a HIGH or TRUE value (block (504). The HIGH or TRUE value engages and/or otherwise couples one or more sense resistors of the resistor array 106.

The operations 500 return to block 502 where the slew detection circuitry 402 compares the difference based on the threshold. However, when the comparison results in the threshold condition no longer being satisfied, then the output signal 410 is driven LOW or FALSE to disengage and/or otherwise decouple the one or more resistors (block 508). In some examples, the slew detection circuitry 402 selects a first quantity of diodes of the diode clamp 302 to be coupled to the one or more resistors in a parallel arrangement. In some examples, the first quantity of diodes are forward biased and a second quantity of diodes are reverse biased, in which the first quantity and the second quantity of diodes are coupled in a parallel arrangement to each other. In some examples, the diode selection switch 412 is closed to select the second quantity of diodes, which may be different than the first quantity of diodes.

Voltage Clamp Improvements

The example SMU 101 of FIG. 1 may be operated in and/or otherwise configured to operate in a forced current mode with the FA 104, the resistor array 106 (e.g., a sense resistor), and the CSA 108 to form a forced current loop with a DUT 116. A voltage across the DUT 116 and a forced current is measured with the VSA 110 and the CSA 108, respectively. In some conditions, in a forced current mode it is desirable to have a voltage clamp to limit the voltage across the DUT 116 if of one or more DUT failures are detected, such as an open-circuit fault.

Some solutions implement a voltage clamp using shunt regulators connected to an output of the FA, which shunts extra current that would otherwise be applied to and/or dissipated on the DUT 116. When a clamp alert (CA) condition is detected using some techniques, one or more transistors are energized to route or divert current to a positive or a negative power supply, which leads to excessive waste current, power dissipation and heating. For instance, under a clamped condition when driving 100 mA with a 48V power supply, approximately 4.8 watts/channel may need to be dissipated. Such techniques cause an area penalty for circuit design so that adequate real estate is maintained for worse case circumstances and adequately-sized transistors must be added for the worse case circumstances. Examples described herein reduce a need for large shunt transistors capable of handling current associated with open circuit DUT faults. Examples described herein include voltage clamp circuitry to limit a DUT voltage by re-adjusting a current forced ($I_{FORCED}$) by the FA 104 in an SMU force current mode via a feedback loop rather than shunting the excess current delivered by the FA 104 when a DUT open circuit occurs.

Figure 6:
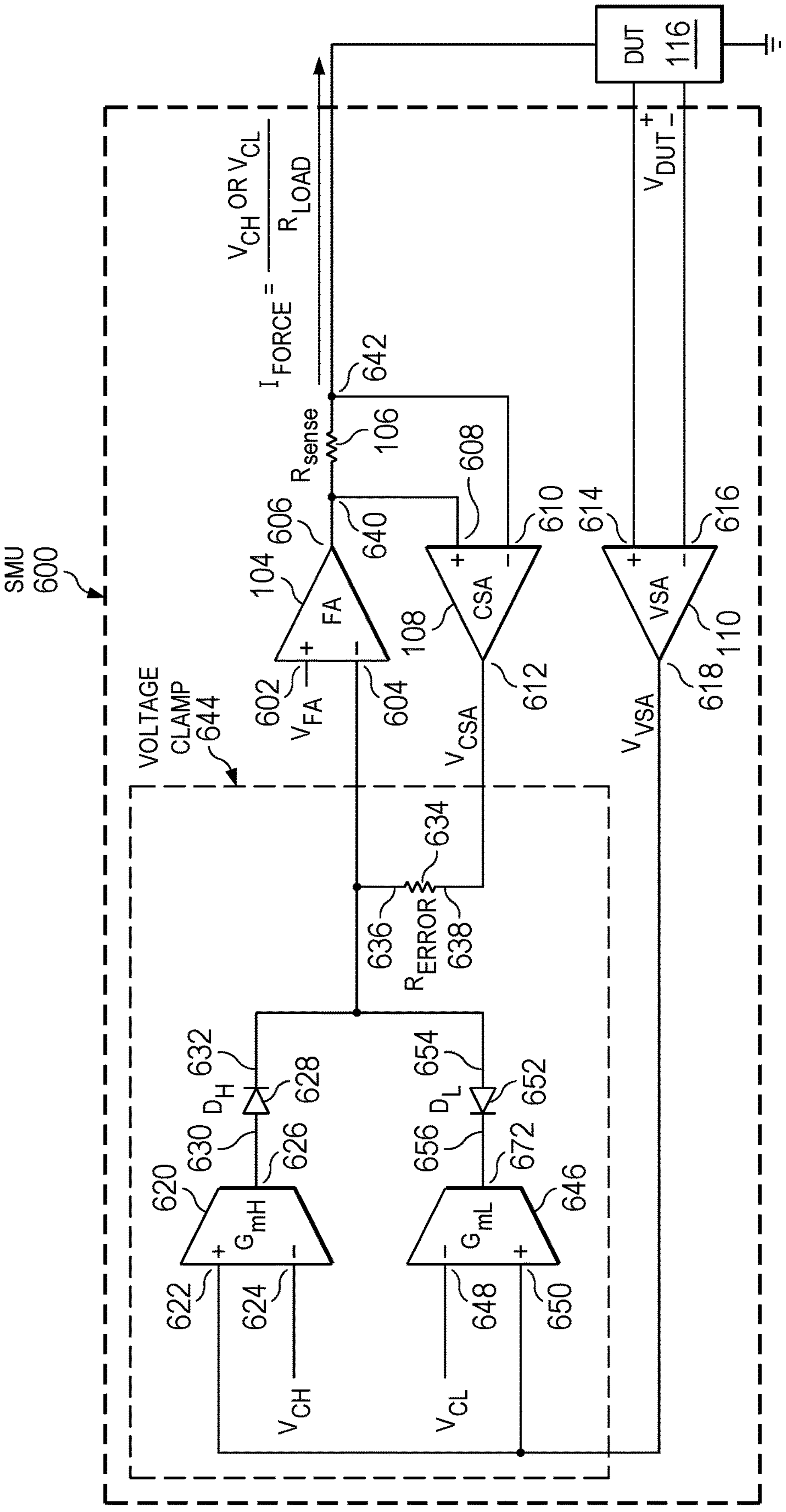
FIG. 6 is a block diagram of an example SMU, or portion thereof, that includes a voltage clamp.

FIG. 6 is an example SMU 600 coupled to the DUT 116. The SMU 600 includes the FA 104, the CSA 108, the VSA 110, and a voltage clamp 644. In the example of FIG. 6, the FA 104 includes a first input 602, a second input 604 and an output 606. In some examples, the first input 602 is a voltage drive setpoint, and the second input 604 is a negative feedback input. The SMU sense resistor array 106 has a first terminal 640 and a second terminal 642 that is used to derive a current load delivered to the DUT 116. The CSA 108 has a first input signal 608, a second input signal 610 and an output signal 612. In some examples, the first input signal 608 is a positive feedback input coupled to the input 640 of the resistor array 106, and the second input is a negative feedback input coupled to the output 642 of the resistor array 106, thereby facilitating an ability to measure a voltage across the resistor array 106. The VSA 110 has a first input signal 614, a second input signal 616 and an output signal 618. In some examples, the first input signal 614 and the second input signal 616 of the VSA 110 are coupled to the DUT 116 to measure a DUT voltage.

The voltage clamp 644 of the SMU 600 includes a first transconductor 620 having a first input signal 622, a second input signal 624 and an output signal 626. The voltage clamp 644 also includes a second transconductor 646 having a first input signal 648, a second input signal 650 and an output signal 672. While the example voltage clamp 644 of FIG. 6 illustrates two transconductors, only the first transconductor 620 corresponding to a high-side will be described herein as a convenience and not a limitation. The voltage clamp 644 includes a first diode 628 having an input 630 and an output 632, of which the input 630 is coupled to the output 626 of the first transconductor 620. The first diode 628 is a blocking diode to prevent current flowing into the forced current loop from a transconductor during normal operation when a clamp alert is not active (e.g., no open-circuit DUT failure is occurring). The voltage clamp 644 includes a second diode 652 having an input 654 and an output 656, of which the output 656 is coupled to the output 672 of the second transconductor 646. The second diode 652 is a blocking diode to prevent current flowing into the forced current loop from a transconductor during normal operation when the clamp alert is not active. The voltage clamp 644 includes a second resistor 634 having a first terminal 636 and a second terminal 638. The first terminal 636 of the second resistor 634 is coupled to the output 632 of the blocking diode DH and to the second input 604 of the FA 104. The second terminal 638 of the second resistor 634 is coupled to the output signal 612 of the CSA 108.

The second resistor 634 ($R_{ERROR}$) is set to a resistance value in a manner consistent with example Equation 3.

$$R_{ERROR} < \frac{1}{f_{VCLAMP} * C_P}. \quad \text{Equation 3}$$

In the example of Equation 3, $C_P$ reflects a parasitic capacitance at a negative terminal of the FA 104 to stabilize the voltage clamp feedback loop, and $f_{VCLAMP}$ is the unity gain bandwidth of the voltage clamp feedback loop. The example of Equation 3 is one constraint associated with $R_{ERROR}$. However, another constraint (and sometimes more substantial) is selecting the product of $R_{ERROR}$ and Gm to be less than A (where A is typically in the range of 50). This provides improved voltage clamp feedback loop stability, and Gm equals Gmh/L. In some examples, Gm is approximately 10 mS, and $R_{ERROR}$ is approximately 5 kOhm.

In operation, the first transconductor 620 is preset to a high-side voltage threshold $V_{CH}$ via the second input 624, and the second transconductor 646 is preset to a low-side voltage threshold $V_{CL}$ via the first input 648. When the output signal 618 of the VSA 110 exceeds the high-side voltage threshold $V_{CH}$, then the first transconductor 620 generates a current at the output 626 to the second resistor 634 ($R_{ERROR}$). For example, $V_{CH}$ is set to 5V, the driving voltage of the FA 104 at the first input 602 is 5V and a gain of the CSA 108 is 5, then the drop across $R_{SENSE}$ is expected to be 1V (e.g., a 10 Ohm resistor). If the DUT 116 is faulty (e.g., open circuit), then the voltage clamp 644 will trigger because $V_{vsA}$ 618 reflects a very high voltage. The first transconductor 620 adjusts to maintain a 5V drop across $R_{ERROR}$ via the negative feedback loop between the FA 104 and the CSA 108, which causes the output current to the faulty DUT 116 to drop to zero. Stated differently, rather than require one or more shunt resistors and/or high current transistors to drive such resistors if a fault, the negative feedback loop prevents the DUT 116 from exceeding a setpoint value.

In some examples, transconductor cells are selected to have a bandwidth that is greater than that of the forced voltage clamp (e.g., a 10× factor assuming approximately 5° degradation in phase margin). Also, even when transconductors are not being used to address circumstances where an open circuit DUT occurs, such transconductors may consume up to approximately 3 mA of current per cell. Also, the VSA 110 is selected to attempt to exhibit a wide bandwidth that is approximately ten times the clamp bandwidth. Without efforts to manage the bandwidth of the VSA 110, additional power consumption results. On the other hand, to help conserve power consumption and improve the voltage clamp feedback loop stability, efforts to reduce the bandwidth of the FA 104 are made. However, a reduction in the FA 104 bandwidth has the possibility of negatively affecting the SMU when operating in other modes (e.g., other than a forced current mode). Examples described below in connection with FIG. 7 address such conditions.

Figure 7:
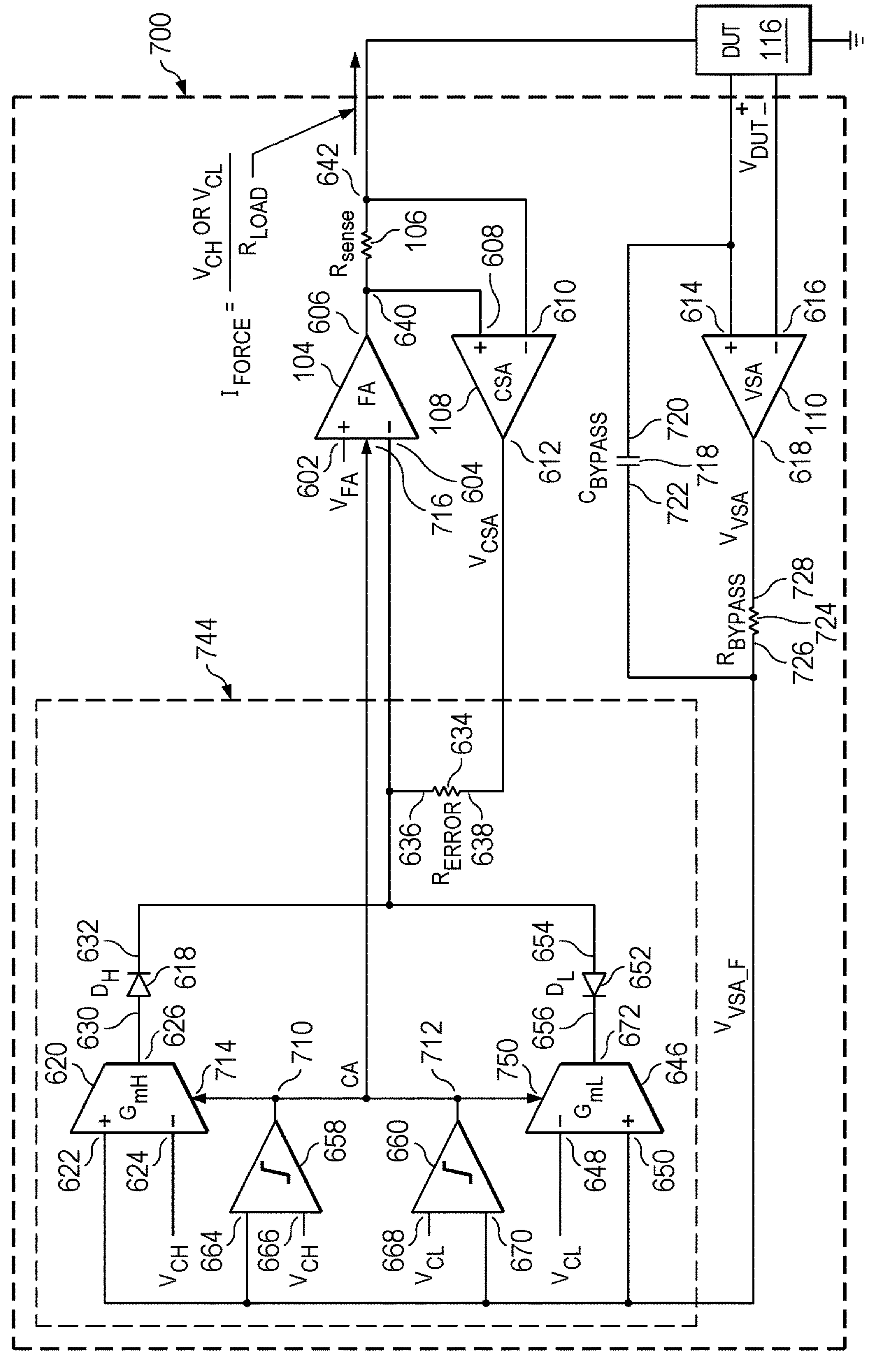
FIG. 7 is a block diagram of the SMU of FIG. 6 utilizing a clamp alert (CA) signal.

FIG. 7 is an example SMU 700 coupled to the DUT 116 and including a voltage clamp 744. Some of the structure of FIG. 7 retains reference numbers consistent with the structure of FIG. 6 and will not be re-defined here. In the example of FIG. 7, at least two structural additions are shown, the first of which includes providing clamp alert (CA) signals to the transconductors (the first transconductor 620 and the second transconductor 646) and to the FA 104. A second structural change shown in the example of FIG. 7 is a high frequency bypass of the VSA 110 using a capacitor and a resistor to mitigate degradation and stability parameters of the clamp loop.

In the example of FIG. 7, the SMU 700 includes the FA 104, the CSA 108, the sense resistor array 106, and the VSA 110 from FIG. 6. The SMU 700 further includes a voltage clamp 744, a first capacitor 718, and a third resistor 724. The voltage clamp 744 includes the first transconductor 620, the second transconductor 646, the first diode 628 and the second diode 652 from FIG. 6. The voltage clamp 744 further includes a first comparator 658 and a second comparator 660. The first comparator 658 has a first input 664, a second input 666, and an output 710. The second comparator 660 has a first input 668, a second input 670 and an output 712.

The first comparator 658 has a first input 664 of the first comparator 658 is coupled to the output signal 618 of the VSA 110 and the second input 666 of the first comparator 658 is a voltage setpoint (high-side). The input 664 of the first comparator 658 is also coupled to the input 622 of the first transconductor 620 and the input 650 of the second transconductor 646. The second input 624 of the first transconductor 620 is coupled to the second input 666 of the first comparator 658, and the first input 648 of the second transconductor 646 is coupled to the first input 668 of the second comparator 660. The second comparator 660 has a first input 670, a second input 668, and an output 712. The first input 670 of the second comparator 660 is coupled to the output signal 618 of the VSA 110, and the second input 668 of the second comparator 660 is a voltage setpoint (low-side).

The output 710 of the first comparator 658 is coupled to the output 712 of the second comparator 660, which is also coupled to both a third input 714 of the first transconductor 620 and a third input 750 of the second transconductor 646. Also, the combined outputs of the first comparator 658 and the second comparator 660 are coupled to a third input 716 of the FA 104.

In the example of FIG. 7, the first capacitor 718 (sometimes referred to as a bypass capacitor) has a first terminal 720 and a second terminal 722. The third resistor 724 (sometimes referred to as a bypass resistor) has a first terminal 728 and a second terminal 726. The first terminal 720 of the first capacitor 718 is coupled to the first input signal 614 of the VSA 110, and the second terminal 722 of the first capacitor 718 is coupled to the second terminal 726 of the third resistor 724. The first terminal 728 of the third resistor 724 is coupled to the output signal 618 of the VSA 110.

In operation of a transconductor, a finite amount of power is consumed when there is no voltage clamp functionality. As such, when the first comparator 658 determines a measured voltage of the DUT 116 is greater than VCH 666 or when the second comparator 660 determines a measured voltage of the DUT 116 is less than VCL 668, a clamp alert (CA) signal is generated (HIGH or TRUE) at the respective output 710 of the first comparator 658 or the output 712 of the second comparator 660. Otherwise such outputs are driven LOW or FALSE. When the CA signal is low, the first transconductor 620 and the second transconductor 646 are in a low power state. The low power state is caused by the LOW input at the third input 714 and the third input 750 of the first transconductor 620 and the second transconductor 646. On the other hand, a HIGH input at the third input 714 and the third input 750 cause an active or high power state of the first transconductor 620 and the second transconductor 646.

Figure 8:
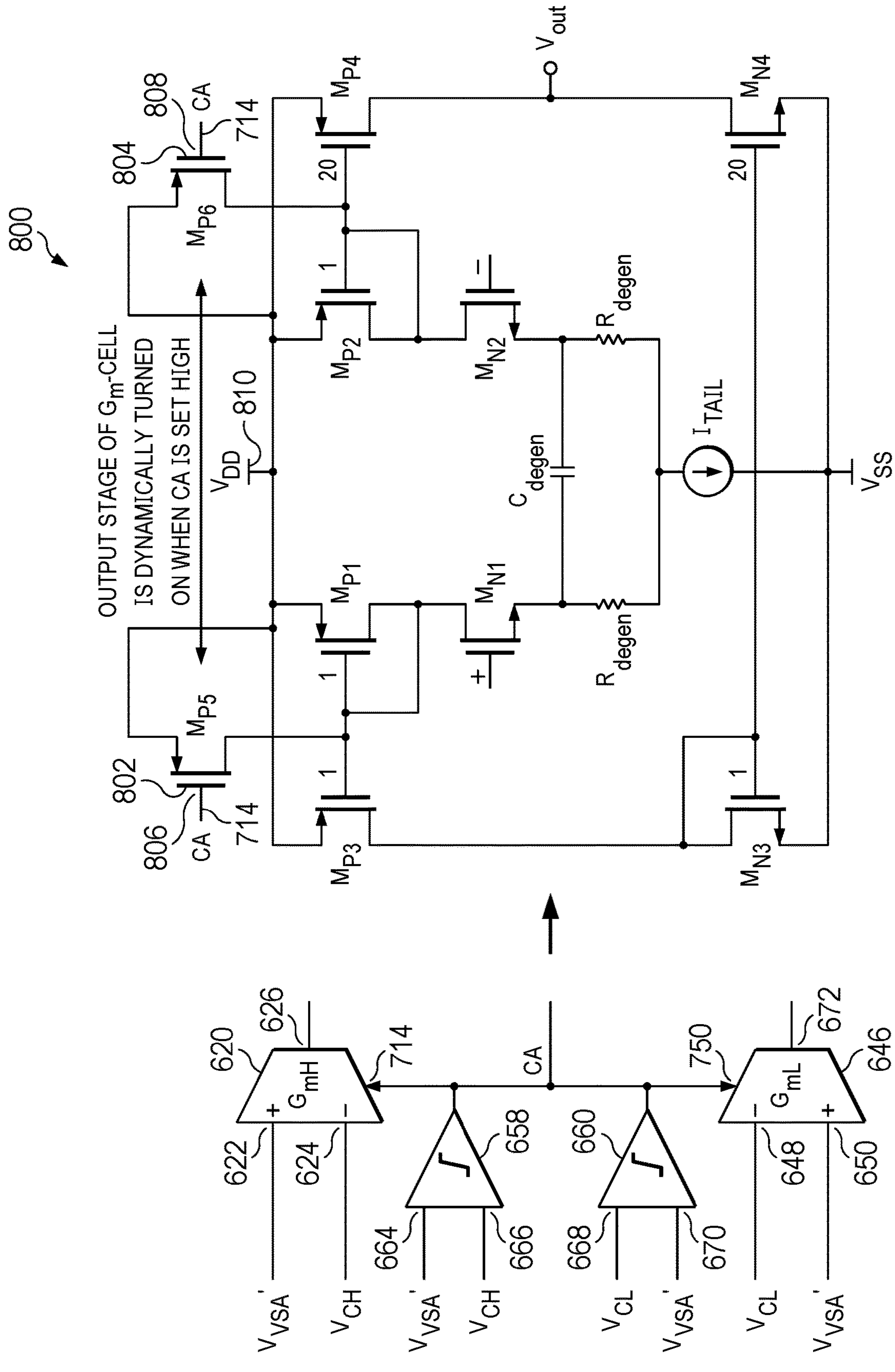
FIG. 8 is a block diagram of an example transconductor implemented in the SMU of FIGS. 6 and 7.

FIG. 8 shows the transconductors 620 and 646, the comparators 568 and 660, and an exploded view 800 of the first transconductor 620 of FIG. 7. The transconductor 646 may have similar structure 800. Similar structure, terminals, inputs and outputs of FIG. 7 are shown in the example of FIG. 8 with the same reference numbers and will not be re-described here.

In the example of FIG. 8, the transconductor 620 structure 800 includes a first transistor MP1, a second transistor MP2, a third transistor MP3, and a fourth transistor MP4. The structure 800 also includes a fifth transistor MP5 802 having an input (control terminal) 806 coupled to the third input 714 of the first transconductor 620, and a sixth transistor MP6 804 having an input (control terminal) 808 coupled to the third input of the first transconductor 620. When the CA signal is low, the transistor 802 and the transistor 804 of the first transconductor 620 are turned on and/or otherwise enabled, which couple a gate of the third transistor MP3 and a gate of the fourth transistor MP4 to a power supply VDD 810, thereby reducing a power consumption of the first transconductor 620. In some examples, enabling the transistor 802 and the transistor 804 reduce a static current from approximately 3 mA to approximately 250 uA. On the other hand, when the CA signal is high, the transistor 802 and the transistor 804 are turned off and/or otherwise disabled to permit the first transconductor 620 to operate.

Figure 9:
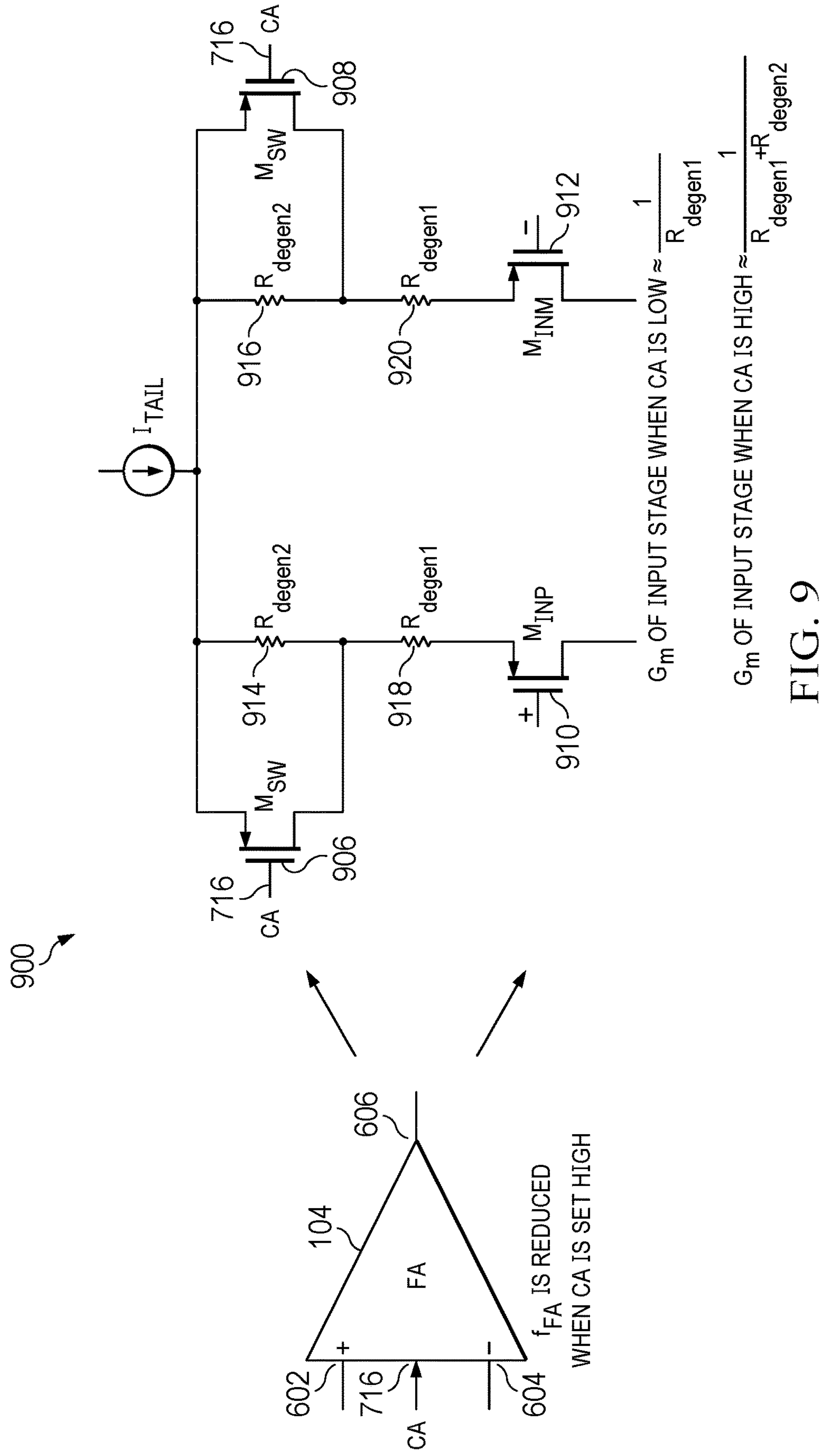
FIG. 9 is a block diagram of a portion of an example force amplifier (FA) used in the SMU of FIG. 8.

Briefly returning to the example of FIG. 7, the CA signal provided to the third input 716 of the FA 104 enables further power conservation when voltage clamp functionality is absent. FIG. 9 is an exploded view 900 of the FA 104 of FIG. 7. Similar structure, terminals, inputs and outputs of FIG. 7 are shown in the example of FIG. 9 with the same reference numbers and will not be re-described here. Generally speaking, example dynamic bandwidth scaling of the FA 104 when a voltage clamp is active decouples a bandwidth constraint on the FA 104. Examples described herein set a bandwidth of the FA 104 based on a speed, noise and/or stability requirement depending on a mode of the SMU (e.g., a forced current mode, a forced voltage mode, etc.). Examples described herein reduce a bandwidth of the FA 104 when the voltage clamp is active, which reduces an impact of phase margin degradation due to non-dominant poles, and it reduces the bandwidth and power constraint on the transconductors and VSA 110.

In the example of FIG. 9, the FA 104 includes a first transistor 906, a second transistor 908, a third transistor 910, a fourth transistor 912, a first resistor 914 (Rdegen2), a second resistor 916 (Rdegen2), a third resistor 918 (Rdegen1), and a fourth resistor 920 (Rdegen1). When the CA signal is driven as a low input into the third input 716 of the FA 104, the first transistor 906 and the second transistor 908 are turned on and/or otherwise enabled. As such, the first resistor 914 and the second resistor 916 are functionally removed from the FA 104. Accordingly, a corresponding transconductance of an input stage of the FA 104 is a function of one of the third resistor 918 or the fourth resistor 920 in a manner consistent with example Equation 4.

$$G_{mFA} \approx \frac{1}{R_{dgen1}}. \quad \text{Equation 4}$$

However, when the CA signal is driven as a high input into the third input 716 of the FA 104, the first transistor 906 and the second transistor 908 are turned off and/or otherwise disabled. As such, the first resistor 914 and the second resistor 916 contribute to the transconductance of the FA 104 in a manner consistent with example Equation 5.

$$G_{mFA} \approx \frac{1}{R_{dgen1} + R_{dgen2}}. \quad \text{Equation 5}$$

A bandwidth of the voltage clamp is determined in a manner consistent with example Equation 6.

$$f_{Vclamp} = (f_{FA})(G_m)(R_{ERROR}). \quad \text{Equation 6}$$

In the example of Equation 6, $f_{FA}$ is the bandwidth of the FA 104 and is proportional to $Gm_{FA}$, in which Gm is the value of the first transconductor 620. As a result of a high CA signal, the bandwidth of the FA 104 is reduced, thereby further improving (reducing) power dissipation.

Returning to the example of FIG. 7, a high frequency bypass of the VSA 110 that is formed by the first capacitor 718 and the third resistor 724 mitigates degradation and stability parameters of the voltage clamp loop. For low frequencies, the first capacitor 718 is electrically open, so a voltage of the output signal 618 of the VSA 110 is provided to respective inputs of the first transconductor 620, the second transconductor 646, the first comparator 658 and the second comparator 660. However, at relatively high frequencies, the first capacitor is an electrical short. As such, relatively lower bandwidth VSA devices may be implemented in the SMU to further reduce power dissipation of the overall SMU.

Figure 10:
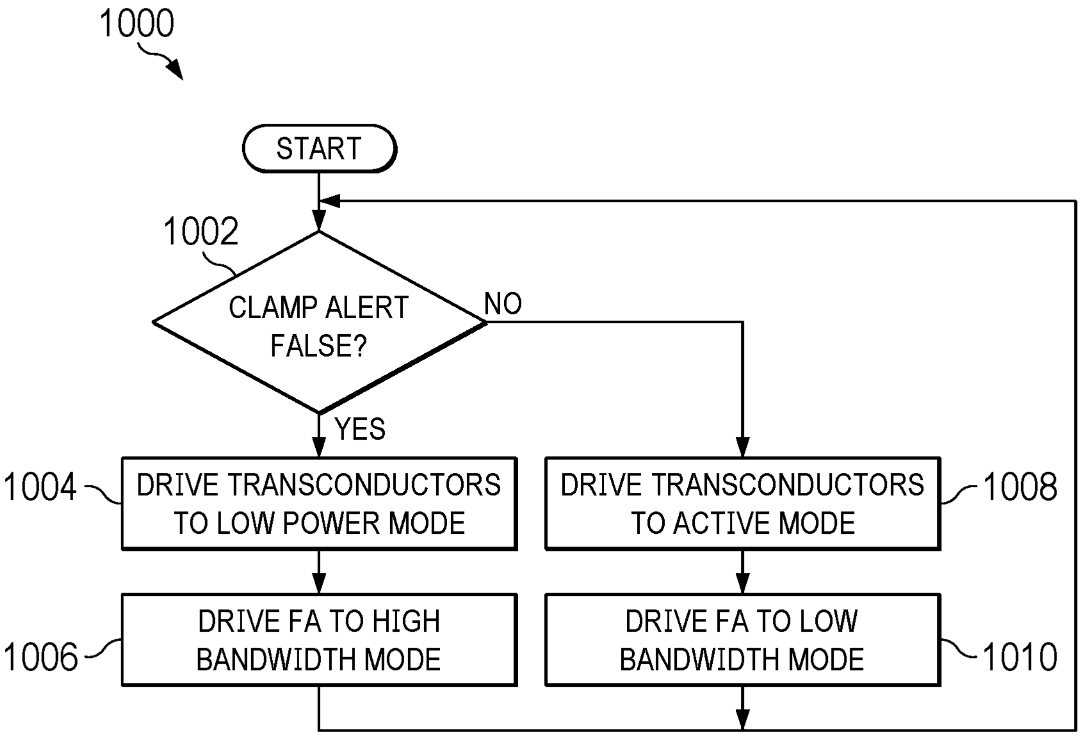
FIG. 10 is a flowchart representative of example operations that may be performed to implement a clamp alert in the FA of FIG. 9.

FIG. 10 is a flowchart representative of example operations 1000 that may be performed by circuitry to control power and bandwidth modes. The example operations 1000 of FIG. 10 begin at block 1002, at which the first comparator 658 and the second comparator 660 compare signals to determine whether the clamp alert (CA) is false. In some examples, the comparators detect a difference value between a measured output voltage and a setpoint. As described above, for example, CA is FALSE or absent when there is no protection for a DUT 116, such as an open circuit. Accordingly (block 1002=YES), the output(s) of the first comparator 658 and the second comparator 660 drive the third input 714 of the first transconductor 620 and the third input 750 of the second transconductor 646 to a low state (block 1004). Responsively, the transconductors operate in a low power mode. Also, the output(s) of the first comparator 658 and/or the second comparator 660 drive the third input 716 of the FA 104 to a low state (block 1006). Responsively, the FA 104 operates in a high bandwidth mode.

If CA is TRUE or HIGH, such as when voltage clamp functionality is operating to protect a DUT 116 (e.g., an open circuit condition) (block 1002=NO), the output(s) of the first comparator 658 and/or the second comparator 660 drive the third input 714 of the first transconductor 620 and the third input 750 of the second transconductor 646 to a high state (block 1008). Responsively, the transconductors operate in an active mode. Accordingly, the CA signal is driven HIGH, and this HIGH CA signal is provided to the FA 104. Also, the output(s) of the first comparator 658 and/or the second comparator 660 drive the third input 716 of the FA 104 to a high state (block 1010). Responsively, the FA 104 operates in a low bandwidth mode (e.g., an active mode). As described above, the CA signal is also provided to one or more transconductors to control whether the transconductors operate in a low power mode or an active mode.

Common Mode Range Improvements

In a force current mode (e.g., when the force current switch 166 is closed), the SMU 101 is expected to maintain a particular accuracy for a complete range of voltage values applied to the DUT 116 (e.g., a range of 0V to 45V). This expectation represents a high output impedance requirement for the force current output. The force current output is indirectly measured as linearity (INL and DNL) and endpoint errors (offset and gain error) of the output current. Also, the output current is in the presence of a load impedance that translates to a complete 45V swing at terminals of the DUT 116. Also, the path for current measurement is expected to maintain a degree of accuracy for the complete range (e.g., 0V to 45V) over the DUT 116, which is measured as a common mode rejection ratio (CMRR). Generally speaking, measurement accuracy expectations improve when CMRR values greater than 100 dB are implemented.

Figure 11:
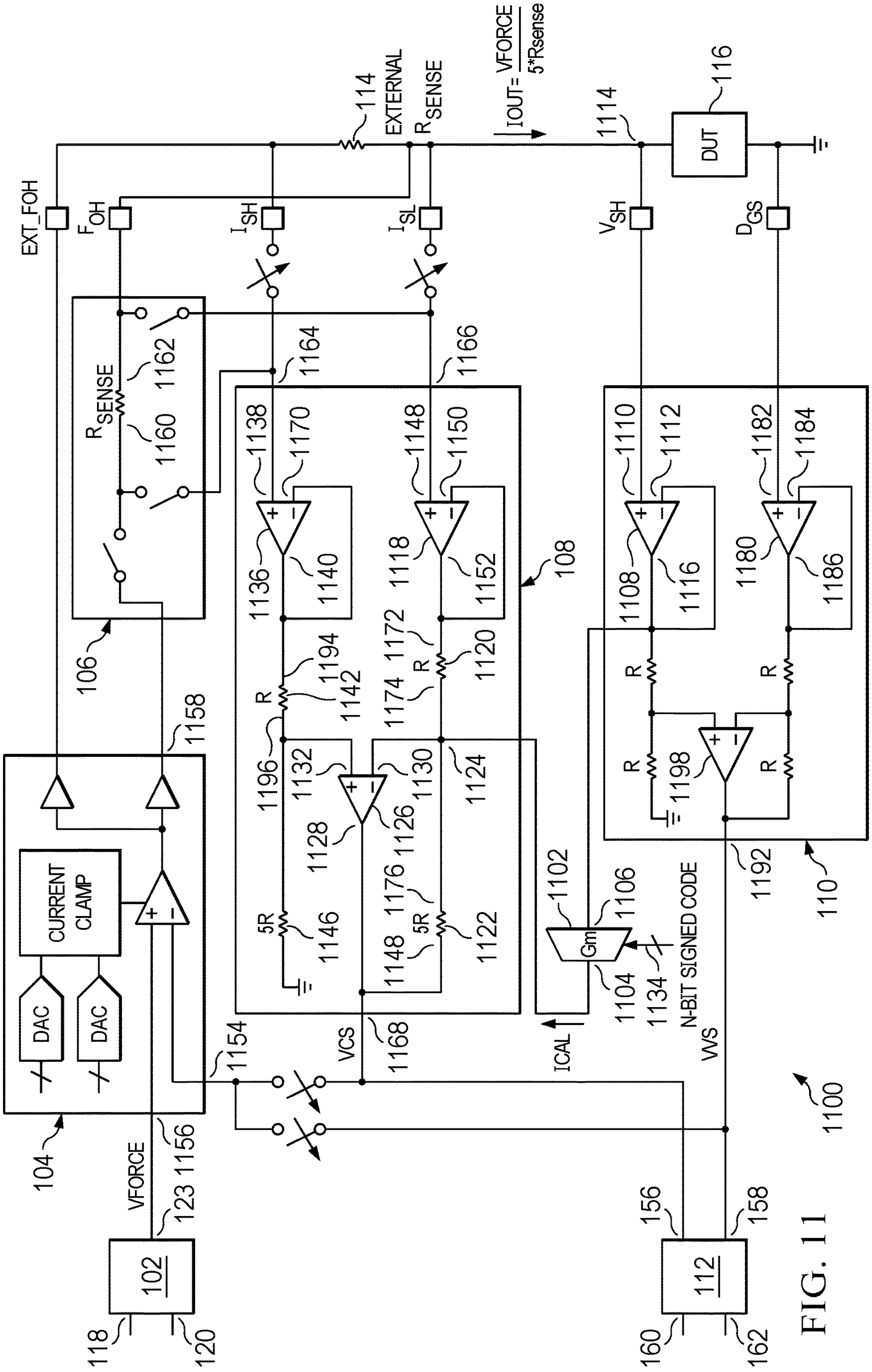
FIG. 11 is a block diagram of the SMU of FIG. 1 with transconductor circuitry.

At least one source of error in force current measurements are associated with changes to the DUT voltage and matching of gain setting resistors in the CSA 108. FIG. 11 is an alternate view 1100 of the example SMU 101 of FIG. 1 in which similar structure includes similar reference numbers. For ideal current sense amplifiers, an output current (IOUT) in a force current mode is determined in a manner consistent with example Equation 7.

$$IOUT = \frac{VFORCE}{5 * R_{SENSE}}. \quad \text{Equation 7}$$

However, a finite CMRR of the CSA causes IOUT to vary as a function of output common mode voltage (VSH) in a manner consistent with example Equation 8.

$$IOUT = \frac{VFORCE}{5 * R_{SENSE}} - \frac{VSH}{CMRR * R_{SENSE}}. \quad \text{Equation 8}$$

The CMRR of the CSA is sometimes limited by current sense gain resistance matching in a manner consistent with example Equation 9.

$$CMRR_{IOUT} \propto \frac{R}{\Delta R}. \quad \text{Equation 9}$$

In the example of Equation 9, a ratio of delta-R to R is a current sense gain resistance mismatch sigma. To meet accuracy specifications and/or expectations in force current and current measurement modes of the SMU, values of $CMRR_{IOUT}$ of approximately 105 dB are expected. While existing techniques to improve CMRR values include using precision thin film resistors and/or increasing resistor area footprints, such approaches are expensive and may not meet target CMRR values.

Examples described herein include on-chip calibration techniques and structure, as shown in the example of FIG. 11. In the example of FIG. 11, the SMU 1100 includes the FA 104, the resistor array 106, the CSA 108, the VSA 110, which measures voltage of the DUT 116. The CSA 108 includes a first input 1164, a second input 1166 and an output 1168. The first input 1164 is coupled to a first input 1138 of a first buffer 1136, the second input 1166 is coupled to a first input 1148 of a second buffer 1118, and the output 1168 is coupled to an output 1128 of a third buffer 1126. In some examples, the first buffer 1136, the second buffer 1118, and the third buffer 1126 are amplifiers having a particular gain value.

The CSA 108 includes four (4) feedback resistors (also referred to as gain resistors), which include a first feedback resistor 1142, a second feedback resistor 1146, a third feedback resistor 1120, and a fourth feedback resistor 1122. An output 1140 of the first buffer 1136 is coupled to a first terminal 1194 of the first feedback resistor 1142, an output 1152 of the second buffer 1118 is coupled to a first terminal 1172 of the third feedback resistor 1120, a first input 1132 of the third buffer 1126 is coupled to a second terminal 1196 of the second feedback resistor 1146. A second input 1130 of the third buffer 1126 is coupled to a second terminal 1124 of the third feedback resistor 1120, which is also coupled to a first terminal 1176 of the fourth feedback resistor 1122. The second terminal 1124 of the third feedback resistor 1120, the first terminal 1176 of the fourth feedback resistor 1122 and the second input 1130 of the third buffer 1126 are sometimes referred to as a summing junction (hereinafter referenced as 1124).

The SMU 1100 of FIG. 11 includes a transconductor 1102 having an input 1106, an output 1104 and a control signal input 1134. The SMU 1100 of FIG. 11 also includes the VSA 110 having a first input 1188, a second input 1190 and an output 1192. The VSA 110 of FIG. 11 includes a first buffer 1108, a second buffer 1180 and a third buffer 1198. The input 1106 of the transconductor 1102 is coupled to an output 1116 of the first buffer 1108, and the output 1104 of the transconductor 1102 is coupled to the summing junction 1124. Taken together, the FA 104, the resistor array 106 and the CSA 108 form a forced current feedback loop. By way of the negative feedback of the FA 104, a target current value is maintained by reading or sensing the voltage across the resistor array 106 ($R_{SENSE}$).

As described above, at least one factor that affects an accuracy of forced current to the DUT 116 is the voltage over the DUT 116. The DUT 116 has a particular resistance value, and as input current changes a corresponding voltage change could be as high as 45V. This value comes as an input to the CSA 108 via $R_{SENSE}$ 106, which has a full scale value of 1V maximum. As such, while the differential input voltage (e.g., the difference between a voltage at the first input 1164 and the second input 1166) of the CSA 108 is −1V to +1V, and the common-mode voltage (e.g., an average of the first input 1164 and the second input 1166) could be as high as 45V. This is a relatively substantial swing that causes measurement error by the CSA 108 (a function of CMRR). To remove this effect, feedback resistor mismatch (e.g., a mismatch of the first feedback resistor 1142, the second feedback resistor 1146, the third feedback resistor 1120 and the fourth feedback resistor 1122) is addressed to prevent unequal divisions.

In operation, the transconductor 1102 converts a measured voltage of the DUT 116 to a current, in which a transconductance of the transconductor 1102 is programmatically adjustable via the control signal input 1134. In some examples, the current generated by the transconductor 1102 is referred to as a calibration current. The transconductor 1102 provides the calibration current to the summing junction 1124 of the CSA 108. The calibration current induces a voltage (VCS) at the output 1168 of the CSA 108 that is equal and opposite to the CMRR error caused by any feedback resistor mismatch that may be present.

In some examples, the control signal input 1134 is determined by one or more calibration procedures in which an error in an output current (ΔIOUT) is calculated by sweeping voltage input values (VSH) of the VSA 110. The output current values (ΔIOUT) are used in the calculation of CMRR in a manner consistent with example Equation 10.

$$CMRR = \frac{\Delta VSH}{(\Delta I_{OUT} * R_{SENSE})}. \qquad \text{Equation 10}$$

In the example of FIG. 10, $\Delta_{VSH}$ represents a change in the DUT voltage and $\Delta_{IOUT}$ represents a resultant change in IOUT. The example calibration technique also includes determining a factor (K) in a manner consistent with example Equation 11.

$$K = \frac{CMRR_{MIN}}{CMRR}. \qquad \text{Equation 11}$$

A digital input value for the control signal input 1134 of the transconductor 1102 is determined in a manner consistent with example Equation 12.

$$D = K * 2^N. \qquad \text{Equation 12}$$

In the example of Equation 12, N represents a resolution of the transconductor, which may be calculated in view of minimum CMRR values and target (post-calibration) CMRR values. For example, for a pre-calibration minimum CMRR value of 75 dB and a target post-calibration CMRR value of 105 dB, a full scale transconductance is determined in a manner consistent with example Equation 13.

$$Gm(\text{full scale}) = \frac{1}{(CMRR_{min} * R_1)}. \qquad \text{Equation 13}$$

In the example of Equation 13, $R_1$ represents resistors of FIG. 12, described below where gain/feedback resistor 5R is divided into 5R1 and 5(R-R1). A corresponding transconductance step size is determined in a manner consistent with example Equation 14.

$$Gm(\text{step size}) = \frac{1}{(CMRR_{PostCal} * R_1)}. \qquad \text{Equation 14}$$

A resolution of the transconductor is determined in a manner consistent with example Equation 15.

$$N = \log 2 \frac{Gm_{Full\ Scale}}{Gm_{Step\ Size}}. \qquad \text{Equation 15}$$

Accordingly, a calibrated input (digital code) to the control signal input 1134 of the transconductor may be determined in a manner consistent with example Equation 12.

In some examples, providing the calibration current (ICAL) to the virtual ground of the CSA 108 causes relatively large voltage variations. This may introduce some error in the calibration current due to a finite output impedance of the transconductor 1102. Also, in some examples a transconductance step size may be relatively small due to large values of R (e.g., 8 kOhm) resulting in small ICAL steps. Responsively, as ICAL error may result due to leakage currents of different portions of the CSA 108, resulting in accuracy reduction.

Figure 12:
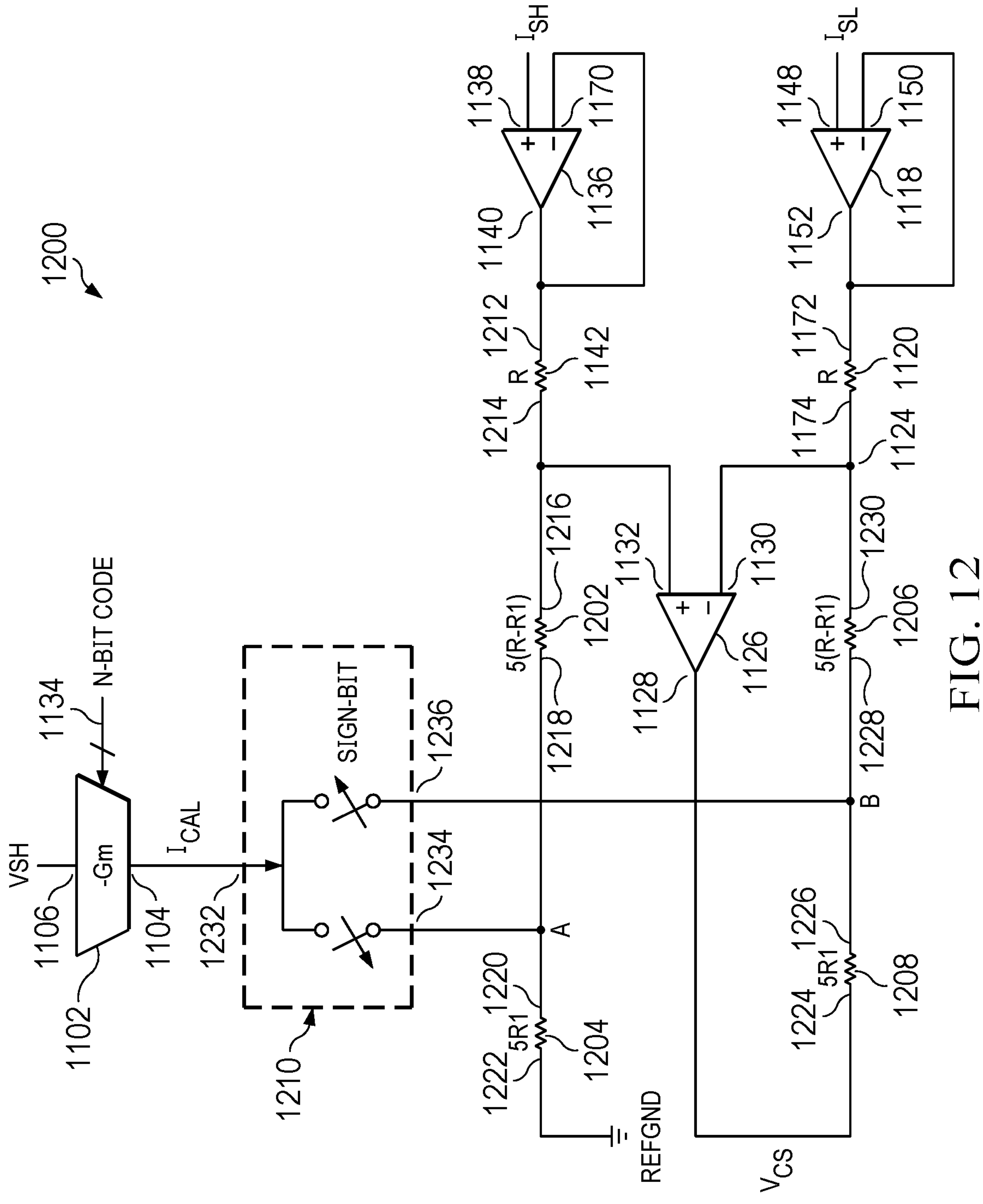
FIG. 12 is a block diagram of an example calibration loop of a current sense amplifier (CSA).

FIG. 12 is an alternate analog calibration loop of the CSA 108 to address potential issues caused by relatively large voltage variations, relatively small step sizes, temperature deviations and the accuracy reductions caused by such circumstances. The example of FIG. 12 includes similar reference numbers as shown in FIG. 11 to designate similar structure, and will not be re-described. The example of FIG.

12 includes a manner of providing ICAL to internal terminals of the CSA 108 in which a ratio of gain (e.g., feedback) resistors is configured.

The CSA 108 includes the third buffer 1126 (e.g., or amplifier), a first feedback resistor 1202, a second feedback resistor 1204, a third feedback resistor 1206, and a fourth feedback resistor 1208. The example first feedback resistor 1202 includes a first terminal 1216 coupled to the first input 1132 of the third buffer 1126 and a second terminal 1220 coupled to the second feedback resistor 1204. A ratio of the second feedback resistor 1204 (5R1) to 5R is X, where X<<1. The third feedback resistor 1206 includes a first terminal 1230 coupled to the second input 1130 of the third buffer 1126, and a second terminal 1228 coupled to a first terminal 1226 of the fourth feedback resistor 1208.

In operation, the output 1104 of the transconductor 1102 is provided to a transconductor switch 1210 to control whether $I_{CAL}$, is directed to the second terminal 1228 (see "A") or the second terminal 1220 (see "B") of the second feedback resistor 1204. Because CMRR may be positive or negative depending on feedback resistor mismatch, the transconductor 1106 is controlled by a bit code in signed magnitude format to the control signal input 1134. In particular, a sign bit is used to control whether the calibration current is fed into "A" or "B." Generally speaking, CMRR can be positive or negative, and the applied correction is negative or positive to cancel error(s) due to the CMRR. However, in this example the direction of $I_{CAL}$ is always positive (e.g., it flows out of the transconductor 1102). For instance, a change in voltage of the DUT 116 may result in either an increase or a decrease in the output current ($I_{OUT}$) in a force current mode. Stated differently, an error in $I_{OUT}$ may be either positive or negative.

To illustrate, for an example +1V change in the voltage of the DUT 116, a corresponding change in the output current $I_{OUT}$ may be +1 uA or −1 uA. Such sign information of the error in $I_{OUT}$ is conveyed via the control signal input 1134. If the error in $I_{OUT}$ is positive for a +1V change in the voltage of the DUT 116, then calibration current is provided to the second terminal 1220 of the second feedback resistor 1204. Similarly, if the error in $I_{OUT}$ is negative for a +1V change in the voltage of the DUT 116, then calibration current is provided to the second terminal 1228 of the fourth feedback resistor 1208. Providing current to the second terminal 1220 of the second feedback resistor 1204 results in a signal at the output of the CSA 108 increasing for a finite period of time. The output increase forces the current negative feedback loop in a manner that causes correction by decreasing $I_{OUT}$, thereby correcting the error in $I_{OUT}$ caused by the CMRR. Similarly, providing current to the second terminal 1228 of the fourth feedback resistor 1208 causes an output of the CSA 108 to decrease for a finite period of time. The output decrease forces a current negative feedback loop to increase $I_{OUT}$, thereby correcting the error in $I_{OUT}$ caused by the CMRR.

Figure 13:
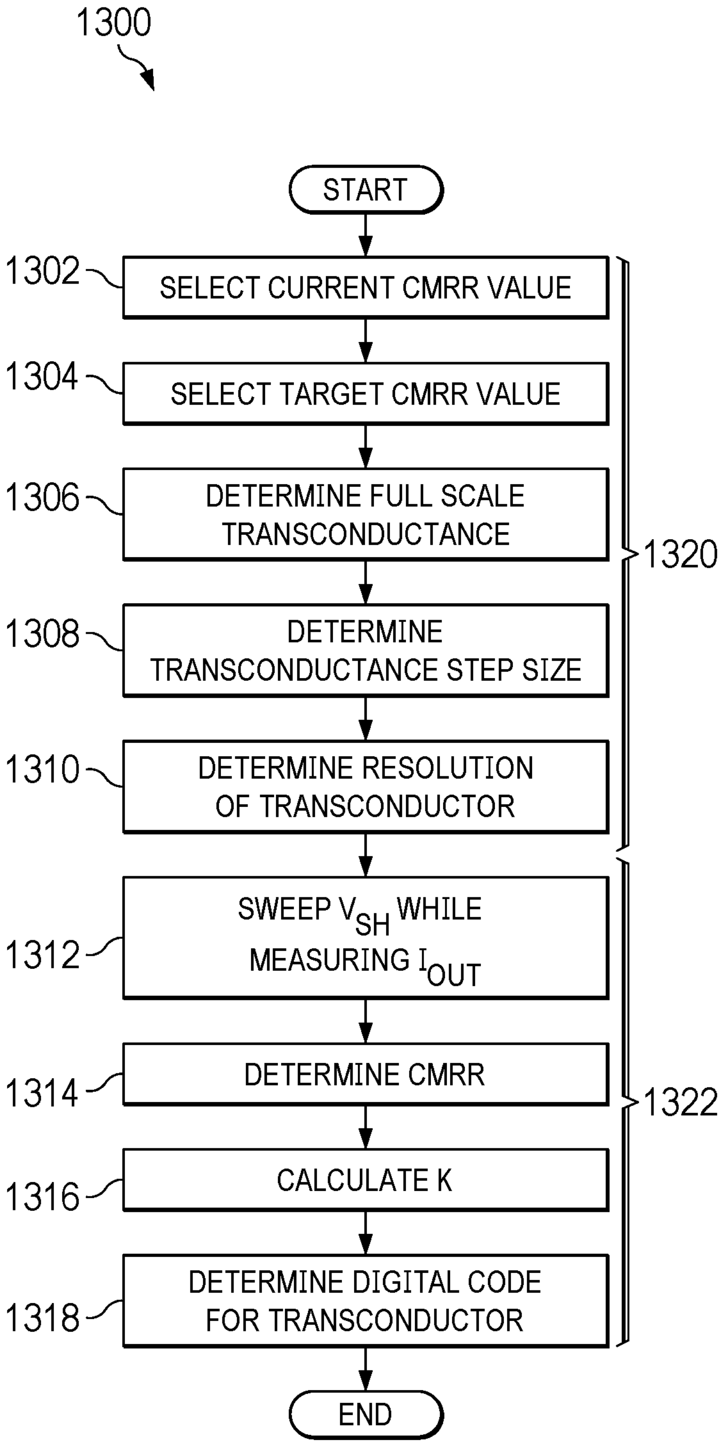
FIG. 13 is a flowchart representative of example operations that may be performed to implement a calibration of the transconductor of FIGS. 11 and 12.

FIG. 13 is a flowchart representative of example operations 1300 that may be performed to establish transconductor design settings (see 1320) and calibrate transconductor settings (see 1322). In some examples the operations 1300 are performed by one or more controllers and/or processor circuitry. In some examples the operations 1300 are performed by processor circuitry of the SMU and/or processor circuitry of a system-on-chip (SoC) including any number of SMUs. In particular, the resolution of a transconductor is determined during its design. A minimum pre-calibration CMRR is estimated from design calculations and/or simulations of the CSA 108, and the target post-calibration CMRR is a design specification, both of which are considered in the example of Equations 13 and 14 above to determine the Gm (full-scale) and Gm (step-size) before determining N. The example operations 1300 of FIG. 13 begin at block 1302, at which a current CMRR value is selected, and a target CMRR value is selected (block 1304). A full scale transconductance is determined in a manner consistent with example Equation 13 (block 1306), and a transconductance step size is determined in a manner consistent with example Equation 14 (block 1308). The resolution of the transconductor is determined in a manner consistent with example Equation 15 (block 1310), and output voltage values of the DUT are swept while measuring an output current (block 1312). A CMRR is determined in a manner consistent with example Equation 10 (block 1314), and a constant value is determined in a manner consistent with example Equation 11 (block 1316). A digital input value for control of the transconductor is determined in a manner consistent with example Equation 12.

Channel Ganging Improvements

In some examples, two or more SMUs or two or more channels of an SMU are ganged together to achieve a relatively higher channel density and/or to drive loads with values that cannot otherwise be accomplished with a single SMU channel (e.g., the SMU channel is current-limited). Some channel ganging techniques include a first channel designated as a master channel that is structured to force a particular electrical characteristic, such as a particular force voltage value. This set point of the master channel is independent of any other channels that are structured as slave channels to mirror the output characteristics of the master. In this example, slave channels do not have flexibility to regulate electrical characteristics of the DUT. To enable two or more channels to be ganged together, relay/switch matrix devices are coupled to force and sense outputs of the SMU. To illustrate, some techniques to gang two SMUs to two separate DUTs require two switches per sense channel and two switches for sense-switch control.

Figure 14:
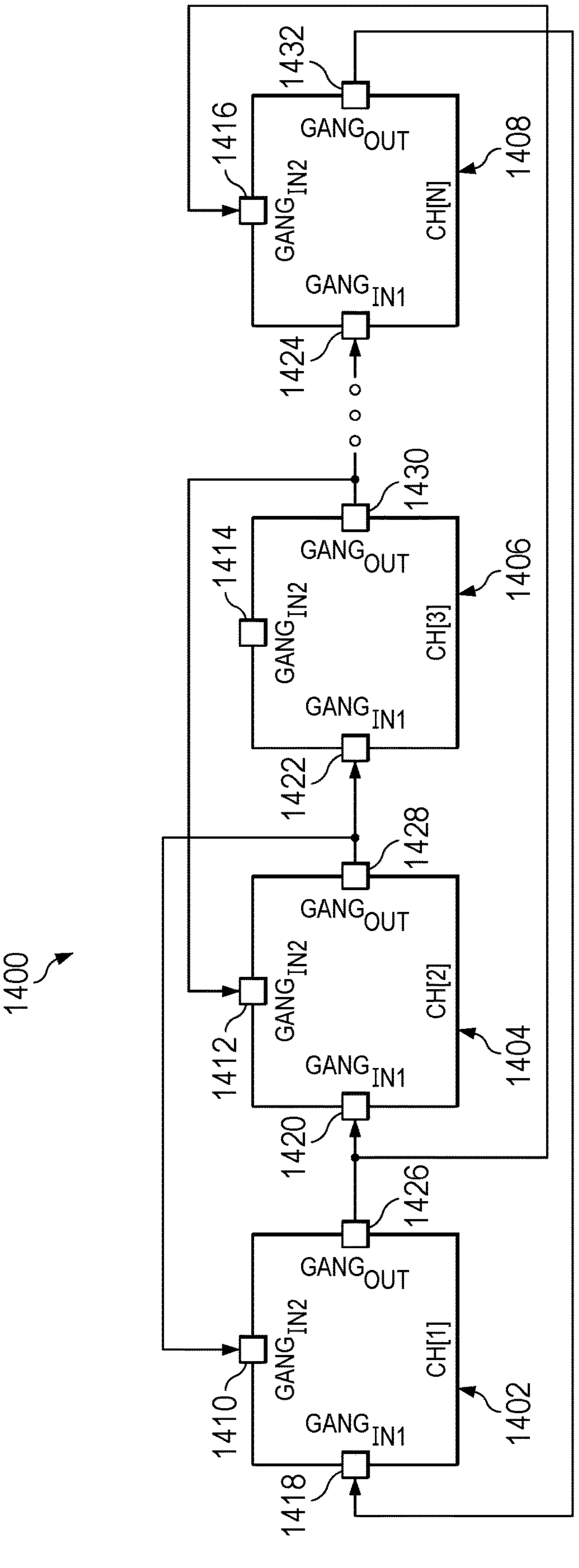
FIG. 14 is a block diagram of an example ganging structure.

Examples described herein include ganging structure and techniques that include fewer on-board switch matrix switches, in which channels can operate in either a master mode or a slave mode as needed. FIG. 14 is a block diagram of a ganging structure 1400 to reduce a switch count of a switch matrix relative to other ganging techniques. In the example of FIG. 14, the structure 1400 includes a first (SMU) channel 1402, a second channel 1404, a third channel 1406, and an Nth channel 1408. While the example of FIG. 14 includes four (4) channels, examples described herein are not limited thereto. The first channel 1402 includes a first gang input 1418, a second gang input 1410 and a gang output 1426. The second channel 1404 includes a first gang input 1420, a second gang input 1412, and a gang output 1428. The third channel 1406 includes a first gang input 1422, a second gang input 1414 and a gang output 1430. The Nth channel 1408 includes a first gang input 1424, a second gang input 1416 and a gang output 1432.

The first gang input 1418 of the first channel 1402 is coupled to the gang output 1432 of a last channel in any gang sequence, which in this example is the Nth channel 1408. The gang output 1426 of the first channel 1402 is coupled to the first gang input 1420 of the second channel 1404 so that it may provide instructions and/or information related to particular electrical characteristics to be applied to a DUT corresponding to one or more subsequent channels in a chain of channels.

Figure 15:
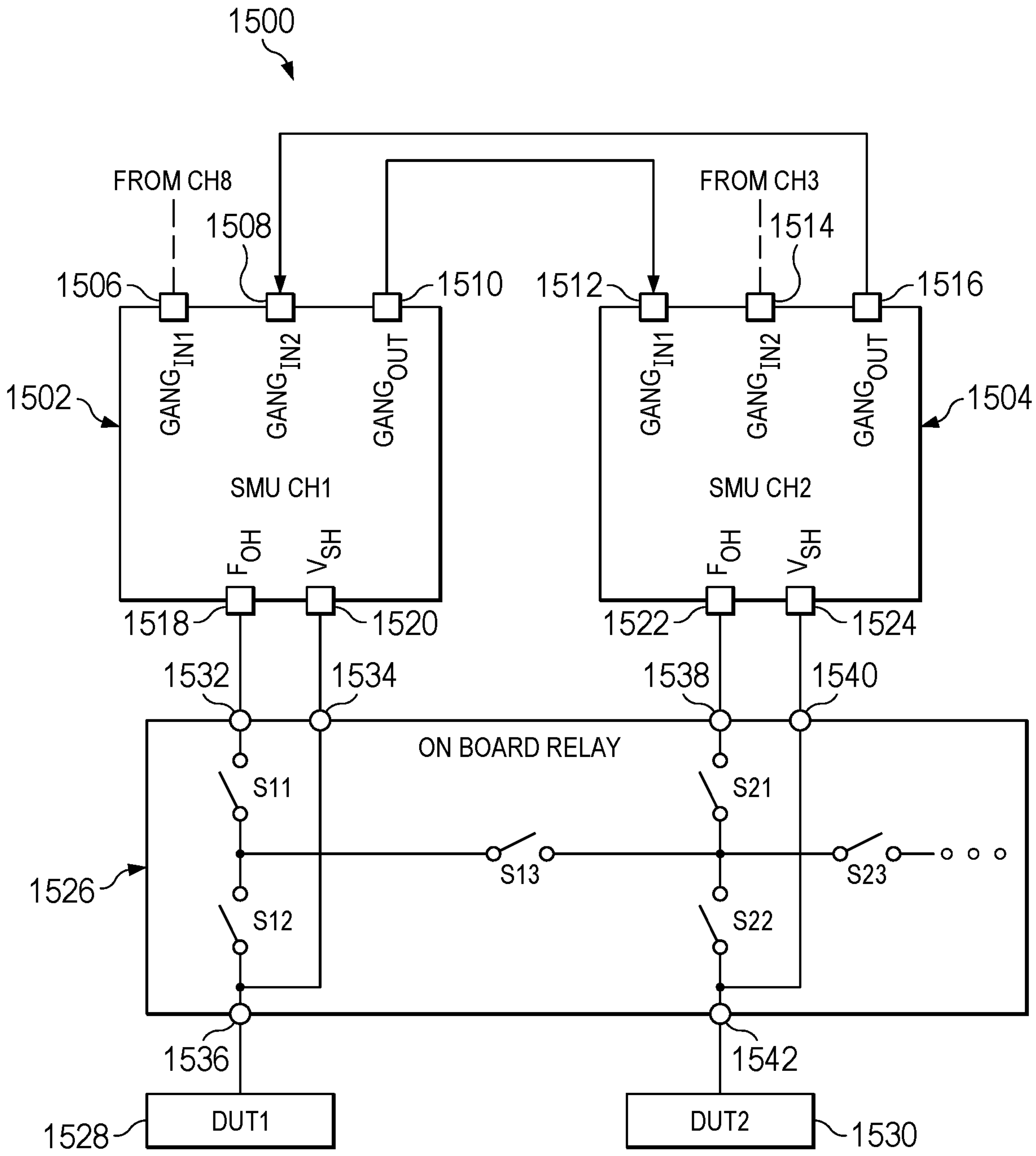
FIG. 15 is a block diagram of an example ganging structure with devices under test.

FIG. 15 is a block diagram of an example SMU ganging structure 1500. In the example of FIG. 15, the structure 1500 includes a first SMU 1502, a second SMU 1504, a switch matrix 1526, a first DUT 1528 and a second DUT 1530. The first SMU 1502 includes a first gang input 1506, a second gang input 1508, a gang output 1510, a force output 1518 and a sense input 1520. The second SMU 1504 includes a first gang input 1512, a second gang input 1514, a gang output 1516, a force output 1522 and a sense input 1524. The switch matrix 1526 has a first input 1532 coupled to the force output 1518 of the first channel 1502, a second input 1534 coupled to the sense input 1520 of the first channel 1502, and a first output 1536 coupled to the first DUT 1528. The switch matrix 1526 also has a third input 1538 coupled to the force output 1522 of the second channel 1504, a fourth input 1540 coupled to a sense input 1524 of the second channel 1504, and a second output 1542 coupled to the second DUT 1530. The switch matrix 1526 also includes a first switch S11, a second switch S12, a third switch S21, a fourth switch S22, a fifth switch S13 and a sixth switch S23. The switches of FIG. 15 may, in some examples, be controlled with one or more controllers.

While the example of FIG. 15 includes two SMUs and two DUTs, examples described herein are not limited thereto. In operation, the ganging structure 1500 may test the first DUT 1528 and the second DUT 1530 in parallel, test only the first DUT 1528 using the combined resources of the first SMU 1502 and the second SMU 1504, or test only the second DUT 1530 using the combined resources of the first SMU 1502 and the second SMU 1504. For example, the first SMU 1502 can source no more than 100 mA of current, and that the second SMU 1504 can source no more than 100 mA of current.

In operation where the first DUT 1528 and the second DUT 1530 are tested in parallel, ganging is not necessary when each DUT is to be tested with no more than 100 mA of current. Accordingly, the first switch S11 and the second switch S12 are closed to permit the first DUT 1528 to be energized by the first channel 1502. Similarly, the third switch S21 and the fourth switch S22 are closed to permit the second DUT 1530 to be energized by the second channel 1504. Also, because no electrical characteristic contributions from combined SMUs are needed, the fourth switch S13 and the fifth switch S23 are opened. In such circumstances where each SMU operates independently with a corresponding DUT, the first gang input 1506 of the first channel 1502 is provided a target electrical characteristic value to control an operation of the first SMU 1502, such as an instruction (e.g., a bit stream) to output 100 mA. Also, when each SMU operates independently, the second gang input 1508 and the gang output 1510 of the first channel 1502 may be disabled.

In operation where the first DUT 1528 is to be tested with a current input of 200 mA, using a single SMU will not be able to accomplish this task. In such a circumstance, the first SMU 1502 is designated as the master and the second SMU 1504 is designated as the slave. In some examples, the first SMU 1502 drives the gang output 1510 with instructions to designate the second SMU 1504 as a slave and to output 100 mA of current. Also, the first SMU 1502 drives the switch matrix 1526 to close the first switch S11, the second switch S12, the third switch S21, and the fifth switch S13, the last of which enables a bridge between the first SMU 1502 and the second SMU 1504. The fourth switch S22 remains open to prevent the second DUT 1530 from having any electrical connection to either SMU because it is not under test.

In operation where the second DUT 1530 is to be tested with a current input of 200 mA, the second SMU 1504 is designated as the master and the first SMU 1502 is designated as the slave. The second SMU 1504 drives the gang output 1516 with instructions to designate the first SMU 1502 as the slave and to output 100 mA of current. Also, the second SMU 1504 drives the switch matrix in an alternate configuration to allow the second DUT 1530 to be electrically connected while the first DUT 1528 is electrically disconnected. In particular, the second SMU 1504 drives the switch matrix 1526 to close the first switch S11, the third switch S21, the fourth switch S22, and the fifth switch S13 (the bridge switch). The second switch S12 is opened to prevent electrical connection of the first DUT 1528.

Figure 16:
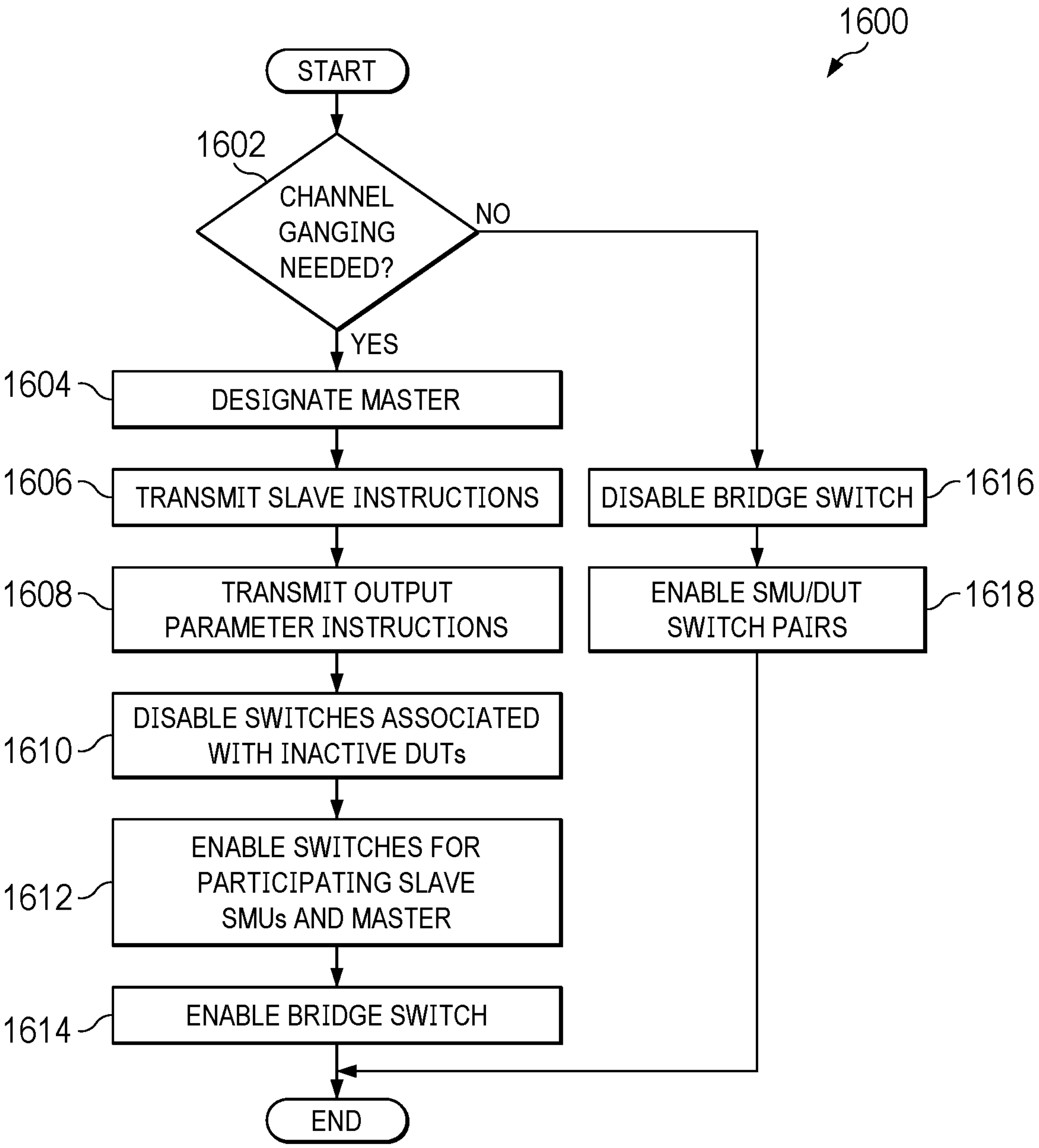
FIG. 16 is a flowchart representative of example operations that may be performed to implement the ganging structure of FIGS. 14 and 15.

FIG. 16 is a flowchart representative of operations 1600 that may be performed to control channel ganging. The example operations may be controlled and/or otherwise provided by a controller and/or the example measurement path circuitry 112. The example operations 1600 of FIG. 16 begin at block 1602, at which the SMU 101 determines whether channel ganging is needed. If so, the SMU designates a master SMU or a master channel (block 1604) and transmits slave instructions to participating slave channels (block 1606). As used herein, slave instructions designate an SMU to augment electrical output characteristics based on input(s) from the master SMU. The master SMU transmits output parameter instructions (block 1608), such as instructions corresponding to electrical output characteristics to be applied to a force output of the channel (e.g., a particular current output value, a particular voltage value, etc.). In some examples, the output parameter instructions are transmitted by the measurement path circuitry 112. The master channel disables switches associated with inactive DUTs (block 1610) and enables switches for participating slave channels/SMUs and the mater channel (block 1612). The master channel enables one or more bridge switches (block 1614) so that the combined electrical characteristics of the two or more participating channels/SMUs can be applied to the DUT.

If channel ganging is not needed (block 1602), such as when each SMU and/or SMU channel has a corresponding DUT to energize, then the bridge switch is disabled (block 1616) and pairs of switches corresponding to channels and DUTs are enabled (block 1618.

As used herein, connection references (e.g., attached, coupled, connected, and joined) may include intermediate members between the elements referenced by at least one of the connection reference or relative movement between those elements unless otherwise indicated. As such, connection references do not necessarily infer that two elements are directly connected or in fixed relation to each other. As used herein, stating that any part is in "contact" with or "directly connected to" another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, or ordering in any way, but are merely used as at least one of labels or arbitrary names to distinguish elements for case of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to at least one of manufacturing tolerances or other real-world imperfections. For example, "approximately" and "about" may indicate such dimensions may be within a tolerance range of +/−10% unless otherwise specified herein.

As used herein, "programmable circuitry" is defined to include at least one of (i) one or more special purpose electrical circuits (e.g., an application specific circuit (ASIC)) structured to perform specific operation(s) and including one or more semiconductor-based logic devices (e.g., electrical hardware implemented by one or more transistors), or (ii) one or more general purpose semiconductor-based electrical circuits programmable with instructions to perform one or more specific functions(s) or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations or functions, Field Programmable Gate Arrays (FPGAs) that may be programmed with second instructions to at least one of configure or structure the FPGAs to instantiate one or more operations or functions corresponding to the first instructions, Graphics Processor Units (GPUs) that may execute first instructions to perform one or more operations or functions, Digital Signal Processors (DSPs) that may execute first instructions to perform one or more operations or functions, XPUs, Network Processing Units (NPUs) one or more microcontrollers that may execute first instructions to perform one or more operations or functions or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example an integrated circuit may be implemented as one or more of an ASIC, an FPGA, a chip, a microchip, programmable circuitry, a semiconductor substrate coupling multiple circuit elements, a system on chip (SoC), etc.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device that is described herein as including certain components may instead be adapted to be coupled to those components to form the described circuitry or device. For example, a structure described as including one or more semiconductor elements (such as transistors), one or more passive elements (such as one of or a combination of resistors, capacitors, or inductors), or one or more sources (such as voltage and/or current sources) may instead include only the semiconductor elements within a single physical device (e.g., at least one of a semiconductor die or integrated circuit (IC) package) and may be adapted to be coupled to at least some of the passive elements or the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in at least one of series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include at least one of a chassis ground, an Earth ground, a floating ground, a virtual ground, a digital ground, a common ground, or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

Modifications are possible in the described embodiments, and other embodiments are possible, within the scope of the claims.

What is claimed is:

1. A circuit comprising:

a force amplifier having an output;

a resistor array having a first terminal coupled to the output of the force amplifier and a second terminal, the resistor array including a plurality of resistors and a plurality of switches each resistor coupled in series to a respective switch, and each series resistor and respective switch coupled in parallel between the first terminal and the second terminal;

a diode clamp including:

a first diode having a first terminal coupled to the first terminal of the resistor array and having a second terminal coupled to the second terminal of the resistor array, the first diode having a first orientation; and a second diode coupled in parallel with the first diode between the first and second terminals of the resistor array, the second diode having a second orientation opposite than the first diode; and a slew detection circuit including an output coupled to one or more of the respective switches.

2. The circuit of claim 1, wherein the diode clamp includes:

a first set of additional diodes coupled in series with the first diode; and a second set of additional diodes coupled in series with the second diode.

3. The circuit of claim 2, wherein the first set of additional diodes is comprised of at least five diodes and the second set of additional diodes is comprised of at least five diodes.

4. The circuit of claim 2, wherein the first set of additional diodes is comprised of exactly five diodes and the second set of additional diodes is comprised of exactly five diodes.

5. The circuit of claim 1, further including:

a diode quantity selection switch controllably coupled to the slew detection circuit, the diode quantity selection switch including:

a first terminal coupled to the first terminal of the first diode; and a second terminal coupled to an output node of a first set of additional diodes in series with the first diode and a second set of additional diodes in series with the second diode.

6. The circuit of claim 5, wherein the output of the slew detection circuit is coupled to a control terminal of the diode quantity selection switch.

7. The circuit of claim 1, further including a first load terminal coupled to the second terminal of the diode clamp.

8. The circuit of claim 7, further comprising:

a device under test (DUT) having a first terminal and a second terminal, wherein the first terminal of the DUT is coupled to the first load terminal and the second terminal of the DUT is coupled to a second load terminal; and a voltage sense amplifier (VSA) having an input, wherein the input of the VSA is coupled to the second load terminal.

9. The circuit of claim 8, wherein the force amplifier further includes a first input and the VSA further includes an output coupled to the first input of the force amplifier.

10. The circuit of claim 8, wherein the VSA comprises multiple comparators and resistors.

11. The circuit of claim 1, wherein the slew detection circuit further comprises a first input coupled to receive an input voltage, a second input coupled to receive a feedback voltage corresponding to a voltage at a device under test (DUT), and a third input coupled to receive a threshold voltage.

12. The circuit of claim 11, wherein the slew detection circuit is configured to close at least one of the respective switches when a difference between the input voltage and the feedback voltage exceeds the threshold voltage.

13. The circuit of claim 11, wherein the output of the slew detection circuit is a logic-high signal when a difference between the input voltage and the feedback voltage exceeds the threshold voltage.

14. The circuit of claim 1, wherein each resistor of the plurality of resistors of the resistor array has a value of either 200 kΩ, 25 kΩ, 5 kΩ, or 500Ω.

15. A method of operating a source measurement unit (SMU) circuit, the method comprising:

supplying a force voltage to a device under test (DUT) through a sense resistor array having a first terminal coupled to an output of a force amplifier and a second terminal coupled to the DUT, the sense resistor array including a plurality of sense resistors selectable via respective switches; and bypassing, by a diode clamp coupled in parallel with the sense resistor array between the first terminal and second terminal, at least a portion of a current supplied by the force amplifier around the sense resistor array when a voltage across the sense resistor array exceeds a conduction threshold of the diode clamp.

16. The method of claim 15, further comprising:

comparing, by a slew detection circuit, a difference between an input voltage signal and a feedback voltage signal corresponding to a voltage at the DUT against a threshold value; and closing, by the slew detection circuit, at least one of the respective switches of the sense resistor array when the difference satisfies the threshold value.

17. The method of claim 16, further comprising:

opening, by the slew detection circuit, at least one of the respective switches when the difference no longer satisfies the threshold value.

18. A source measurement unit system comprising:

a force amplifier having a first input, a second input, and an output;

a resistor array having a first terminal coupled to the output of the force amplifier and a second terminal, the resistor array including a plurality of resistors and a plurality of switches, each resistor coupled in series to a respective switch, and each series resistor and respective switch coupled in parallel between the first terminal and the second terminal;

a diode clamp including:

a first diode having a first terminal coupled to the first terminal of the resistor array and having a second terminal coupled to the second terminal of the resistor array, the first diode having a first orientation; and a second diode coupled in parallel with the first diode between the first and second terminals of the resistor array, the second diode having a second orientation opposite than the first diode;

a slew detection circuit including an output coupled to one or more of the respective switches;

a device under test (DUT) having a first terminal and a second terminal, the first terminal coupled to the second terminal of the resistor array; and a voltage sense amplifier having an input coupled to the second terminal of the DUT and an output coupled to the second input of the force amplifier.

19. The source measurement unit system of claim 18, wherein the diode clamp includes:

a first set of additional diodes coupled in series with the first diode; and a second set of additional diodes coupled in series with the second diode.

* * * * *